United States Patent
Arena et al.

(10) Patent No.: US 9,023,721 B2
(45) Date of Patent: May 5, 2015

(54) METHODS OF FORMING BULK III-NITRIDE MATERIALS ON METAL-NITRIDE GROWTH TEMPLATE LAYERS, AND STRUCTURES FORMED BY SUCH METHODS

(75) Inventors: Chantal Arena, Mesa, AZ (US); Ronald Thomas Bertram, Mesa, AZ (US); Ed Lindow, Cornville, AZ (US)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/988,987

(22) PCT Filed: Nov. 23, 2011

(86) PCT No.: PCT/EP2011/070771
§ 371 (c)(1),
(2), (4) Date: May 22, 2013

(87) PCT Pub. No.: WO2012/069520
PCT Pub. Date: May 31, 2012

(65) Prior Publication Data
US 2013/0244410 A1    Sep. 19, 2013

Related U.S. Application Data

(60) Provisional application No. 61/416,525, filed on Nov. 23, 2010.

(30) Foreign Application Priority Data

Dec. 8, 2010    (FR) ...................................... 10 60271

(51) Int. Cl.
*H01L 21/36* (2006.01)
*H01L 21/02* (2006.01)
(Continued)

(52) U.S. Cl.
CPC ........ *H01L 21/0254* (2013.01); *H01L 21/0242* (2013.01); *H01L 21/02439* (2013.01);
(Continued)

(58) Field of Classification Search
CPC ............ H01L 21/0254; H01L 21/0242; H01L 21/02439; H01L 21/02458; H01L 21/0262; C23C 16/303; C23C 16/0272; C30B 25/02; C30B 29/403
See application file for complete search history.

(56) References Cited

U.S. PATENT DOCUMENTS

| 5,232,508 A | 8/1993 | Arena et al. |
| 5,610,106 A | 3/1997 | Foster et al. |

(Continued)

FOREIGN PATENT DOCUMENTS

| WO | 2008048303 A2 | 4/2008 |
| WO | 2010101715 A1 | 9/2010 |

OTHER PUBLICATIONS

Arena et al., Gas Injectors for CVD Systems with the Same, U.S. Appl. No. 61/157,112, filed Mar. 3, 2009.
(Continued)

*Primary Examiner* — Yasser A Abdelaziez
(74) *Attorney, Agent, or Firm* — TraskBritt

(57) ABSTRACT

Bulk III-nitride semiconductor materials are deposited in an HPVE process using a metal trichloride precursor on a metal nitride template layer of a growth substrate. Deposition of the bulk III-nitride semiconductor material may be performed without ex situ formation of the template layer using a MOCVD process. In some embodiments, a nucleation template layer is formed ex situ using a non-MOCVD process prior to depositing bulk III-nitride semiconductor material on the template layer using an HVPE process. In additional embodiments, a nucleation template layer is formed in situ using an MOCVD process prior to depositing bulk III-nitride semiconductor material on the template layer using an HVPE process. In further embodiments, a nucleation template layer is formed in situ using an HVPE process prior to depositing bulk III-nitride semiconductor material on the template layer using an HVPE process.

12 Claims, 6 Drawing Sheets

(51) Int. Cl.
*C23C 16/02* (2006.01)
*C23C 16/30* (2006.01)
*C30B 25/02* (2006.01)
*C30B 29/40* (2006.01)

(52) U.S. Cl.
CPC ...... *H01L21/02458* (2013.01); *H01L 21/0262* (2013.01); *C23C 16/0272* (2013.01); *C23C 16/303* (2013.01); *C30B 25/02* (2013.01); *C30B 29/403* (2013.01)

(56) References Cited

U.S. PATENT DOCUMENTS

| | | | |
|---|---|---|---|
| 5,635,093 | A | 6/1997 | Arena et al. |
| 5,972,790 | A | 10/1999 | Arena et al. |
| 6,090,705 | A | 7/2000 | Arena et al. |
| 6,121,140 | A | 9/2000 | Arena et al. |
| 6,179,913 | B1 | 1/2001 | Solomon et al. |
| 6,221,174 | B1 | 4/2001 | Chen et al. |
| 6,426,512 | B1 | 7/2002 | Ito et al. |
| 6,784,085 | B2 | 8/2004 | Cuomo et al. |
| 6,929,867 | B2 | 8/2005 | Armitage et al. |
| 7,427,556 | B2 | 9/2008 | Tomasini et al. |
| 7,452,757 | B2 | 11/2008 | Werkhoven et al. |
| 7,482,674 | B1 | 1/2009 | Freitas et al. |
| 7,514,372 | B2 | 4/2009 | Arena et al. |
| 7,666,799 | B2 | 2/2010 | Arena et al. |
| 7,732,306 | B2 | 6/2010 | Arena et al. |
| 7,785,995 | B2 | 8/2010 | Cody et al. |
| 7,816,236 | B2 | 10/2010 | Bauer et al. |
| 7,902,045 | B2 | 3/2011 | Arena et al. |
| 8,154,022 | B2 | 4/2012 | Arena et al. |
| 8,178,427 | B2 | 5/2012 | Arena et al. |
| 8,197,597 | B2 | 6/2012 | Arena et al. |
| 8,236,893 | B2 | 8/2012 | Nakagawa et al. |
| 8,247,314 | B2 | 8/2012 | Arena |
| 8,278,193 | B2 | 10/2012 | Arena |
| 8,318,612 | B2 | 11/2012 | Arena et al. |
| 8,323,407 | B2 | 12/2012 | Arena et al. |
| 8,329,565 | B2 | 12/2012 | Arena et al. |
| 8,367,520 | B2 | 2/2013 | Arena |
| 8,377,802 | B2 | 2/2013 | Lindow et al. |
| 8,382,898 | B2 | 2/2013 | Arena et al. |
| 8,388,755 | B2 | 3/2013 | Arena et al. |
| 8,431,419 | B2 | 4/2013 | Bertram, Jr. et al. |
| 2004/0097022 | A1 | 5/2004 | Werkhoven et al. |
| 2004/0259333 | A1 | 12/2004 | Tomasini et al. |
| 2005/0051795 | A1 | 3/2005 | Arena et al. |
| 2006/0008941 | A1* | 1/2006 | Haskell et al. ........... 438/93 |
| 2006/0234504 | A1 | 10/2006 | Bauer et al. |
| 2006/0281205 | A1* | 12/2006 | Park ........................... 438/22 |
| 2007/0138505 | A1 | 6/2007 | Preble et al. |
| 2007/0259502 | A1* | 11/2007 | Bour et al. ................ 438/285 |
| 2007/0264801 | A1 | 11/2007 | Cody et al. |
| 2008/0026149 | A1 | 1/2008 | Tomasini et al. |
| 2008/0303118 | A1 | 12/2008 | Arena et al. |
| 2009/0091002 | A1 | 4/2009 | Arena et al. |
| 2009/0098343 | A1 | 4/2009 | Arena et al. |
| 2009/0178611 | A1 | 7/2009 | Arena et al. |
| 2009/0184398 | A1 | 7/2009 | Choi |
| 2009/0189185 | A1 | 7/2009 | Arena et al. |
| 2009/0191659 | A1* | 7/2009 | Song ............................ 438/46 |
| 2009/0205563 | A1 | 8/2009 | Arena et al. |
| 2009/0214785 | A1 | 8/2009 | Arena et al. |
| 2009/0223441 | A1 | 9/2009 | Arena et al. |
| 2009/0223442 | A1 | 9/2009 | Arena et al. |
| 2009/0223453 | A1 | 9/2009 | Arena et al. |
| 2009/0283029 | A1 | 11/2009 | Arena et al. |
| 2010/0072576 | A1 | 3/2010 | Arena |
| 2010/0109126 | A1 | 5/2010 | Arena |
| 2010/0124814 | A1 | 5/2010 | Arena |
| 2010/0133548 | A1 | 6/2010 | Arena et al. |
| 2010/0180913 | A1 | 7/2010 | Arena et al. |
| 2010/0187568 | A1 | 7/2010 | Arena |
| 2010/0242835 | A1 | 9/2010 | Arena et al. |
| 2010/0244197 | A1 | 9/2010 | Arena et al. |
| 2010/0244203 | A1 | 9/2010 | Arena |
| 2010/0258053 | A1 | 10/2010 | Arena et al. |
| 2011/0011450 | A1 | 1/2011 | Arena |
| 2011/0024747 | A1 | 2/2011 | Arena et al. |
| 2011/0037075 | A1 | 2/2011 | Arena et al. |
| 2011/0057294 | A1 | 3/2011 | Arena |
| 2011/0101373 | A1 | 5/2011 | Arena et al. |
| 2011/0156212 | A1 | 6/2011 | Arena |
| 2011/0212546 | A1 | 9/2011 | Bertram, Jr. et al. |
| 2011/0212603 | A1 | 9/2011 | Arena et al. |
| 2011/0277681 | A1 | 11/2011 | Arena et al. |
| 2011/0284863 | A1 | 11/2011 | Lindow et al. |
| 2011/0305835 | A1 | 12/2011 | Bertram, Jr. et al. |
| 2012/0048182 | A1 | 3/2012 | Arena et al. |
| 2012/0083100 | A1 | 4/2012 | Bertram, Jr. |
| 2012/0085400 | A1 | 4/2012 | Arena et al. |
| 2012/0132922 | A1 | 5/2012 | Arena et al. |
| 2012/0187541 | A1 | 7/2012 | Arena et al. |
| 2012/0199845 | A1 | 8/2012 | Werkhoven et al. |
| 2012/0211870 | A1 | 8/2012 | Figuet et al. |
| 2012/0280249 | A1 | 11/2012 | Arena |
| 2012/0319128 | A1 | 12/2012 | Arena |
| 2013/0052333 | A1 | 2/2013 | Lindow et al. |
| 2013/0052806 | A1 | 2/2013 | Bertram, Jr. et al. |

OTHER PUBLICATIONS

Armitage et al., Lattice-Matched HfN Buffer Layers for Epitaxy of GaN on Si, Applied Physics Letters, vol. 81, No. 8, Aug. 19, 2002, pp. 1450-1452.
French Search Report and Opinion for French Application No. 1060271 dated Jul. 8, 2011, 8 pages.
Fujii et al., Leakage Current Improvement of Nitride-Based Light Emitting Diodes Using CrN Buffer Layer and its Vertical Type Application by Chemical Lift-Off Process, Applied Physics Letters, vol. 94 (2009), pp. 242108-1-242108-3.
International Search Report for International Application No. PCT/EP2011/070771 dated Feb. 14, 2012, 4 pages.
International Written Opinion for International Application No. PCT/EP2011/070771 dated Feb. 14, 2012, 8 pages.
Kumagai et al., Thermodynamics on Tri-Halide Vapor-Phase Epitaxy of GaN and $In_xGa_{1-x}N$ Using $GaCl_3$ and $InCl_3$, Journal of Crystal Growth, vol. 231 (2001), pp. 57-67.
Nasser et al., GaN Heteroepitaxial Growth Techniques, Journal of Microwaves and Optoelectronics, vol. 2, No. 3, Jul. 2001, pp. 22-31.
Tokuda et al., Plasma-Excited organometallic Vapor Phase Epitaxy of GaN on (0 0 0 1)Sapphire, Journal of Crystal Growth, vol. 173, (1997), pp. 237-243.

* cited by examiner

METHODS OF FORMING BULK III-NITRIDE MATERIALS ON METAL-NITRIDE GROWTH TEMPLATE LAYERS, AND STRUCTURES FORMED BY SUCH METHODS

CROSS-REFERENCE TO RELATED APPLICATIONS

This application is a national phase entry under 35 U.S.C. §371 of International Patent Application PCT/EP2011/070771, filed Nov. 23, 2011, designating the United States of America and published in English as International Patent Publication WO 2012/069520 A1 on May 31, 2012, which claims the benefit under Article 8 of the Patent Cooperation Treaty and under 35 U.S.C. §119(e) to U.S. Provisional Patent Application Ser. No. 61/416,525, filed Nov. 23, 2010, and to French Patent Application Serial No. 1060271, filed Dec. 8, 2010, the disclosure of each of which is hereby incorporated herein by this reference in its entirety.

FIELD

Embodiments of the invention generally relate to methods for depositing III-nitride materials on substrates, and structures formed by such methods. More particularly, embodiments of the invention relate to methods for depositing III-nitride materials on substrates that include a growth template layer comprising a metal-nitride material, and structures formed by such methods.

BACKGROUND

Chemical vapor deposition (CVD) is a chemical process that is used to deposit solid materials on substrates, and is commonly employed in the manufacture of semiconductor devices. In chemical vapor deposition processes, a substrate is exposed to one or more reagent gases, which react, decompose, or both react and decompose in a manner that results in the deposition of a solid material on the surface of the substrate.

One particular type of CVD process is referred to in the art as vapor phase epitaxy (VPE). In VPE processes, a substrate is exposed to one or more reagent vapors in a reaction chamber, which react, decompose, or both react and decompose in a manner that results in the epitaxial deposition of a solid material on the surface of the substrate. VPE processes are often used to deposit III-V semiconductor materials. When one of the reagent vapors in a VPE process comprises a halide vapor, the process may be referred to as a halide vapor phase epitaxy (HVPE) process.

It is known in the art to form III-nitride semiconductor materials, such as gallium nitride (GaN), using VPE processes in which metallorganic (MO) precursor materials are decomposed within a reaction chamber to form the III-nitride semiconductor material. Such processes are often referred to as metallorganic vapor phase epitaxy (MOVPE) processes, and may also be characterized as metallorganic chemical vapor deposition (MOCVD) processes. Such MOVPE processes are commonly performed utilizing several sequential pre-deposition processes prior to the deposition of the desired bulk III-nitride semiconductor material. These sequential pre-deposition processes may include a high temperature hydrogen bake of the growth substrate (e.g., a sapphire substrate), nitridation of the growth substrate, formation of a nucleation layer of a III-nitride material at relatively low temperatures on the growth substrate, annealing of the nucleation layer at relatively higher temperatures, coalescence of the nucleation layer, and finally growth of the bulk III-nitride material layer on the nucleation layer.

HVPE processes are also used to form III-nitride semiconductor materials such as gallium nitride (GaN). In such processes, epitaxial growth of GaN on a substrate may result from a vapor phase reaction between gallium mono-chloride (GaCl) and ammonia ($NH_3$) that is carried out within a reaction chamber at elevated temperatures between about 500° C. and about 1,000° C. The $NH_3$ may be supplied from a standard source of $NH_3$ gas. In some methods, the GaCl vapor is provided by passing hydrogen chloride (HCl) gas (which may be supplied from a standard source of HCl gas) over heated liquid gallium (Ga) to form GaCl in situ within the reaction chamber. The liquid gallium may be heated to a temperature of between about 750° C. and about 850° C. The GaCl and the $NH_3$ may be directed to (e.g., over) a surface of a heated substrate, such as a wafer of semiconductor material. U.S. Pat. No. 6,179,913, which issued Jan. 30, 2001 to Solomon et al., discloses a gas injection system for use in such systems and methods.

The several sequential pre-deposition processes mentioned above in relation to the MOVPE processes used to form bulk III-nitride semiconductor materials can be difficult to conduct within an HVPE deposition reactor.

BRIEF SUMMARY

This summary is provided to introduce a selection of concepts in a simplified form that, which concepts are further described in the detailed description below of some example embodiments of the invention. This summary is not intended to identify key features or essential features of the claimed subject matter, nor is it intended to be used to limit the scope of the claimed subject matter.

As previously discussed, the several sequential pre-deposition processes used to form a nucleation layer of III-nitride material on the growth substrate prior to depositing bulk III-nitride semiconductor material on the nucleation layer can be difficult to conduct within an HVPE deposition reactor. As a result, known HVPE methods used to deposit bulk III-nitride semiconductor material have commonly utilized a growth substrate that includes a nucleation layer of metal-nitride material deposited ex situ (i.e., in a separate deposition process carried out in a separate chamber) on a substrate using an MOCVD process. The desired bulk III-nitride material is then deposited on the growth substrate in a separate HVPE process carried out in a separate chamber.

In some embodiments, the present invention includes methods of depositing bulk III-nitride semiconductor materials on growth substrates. A metal-nitride nucleation template layer is formed on a substrate to form a growth substrate, and bulk III-nitride semiconductor material is deposited on the growth substrate using a halide vapor phase epitaxy (HVPE) process. Depositing the bulk III-nitride semiconductor material on the growth substrate may comprise decomposing at least one of a metal trichloride and a metal tetrachloride to form a metal chloride Group III precursor vapor, and reacting the metal chloride Group III precursor vapor with a Group V precursor vapor to form the bulk III-nitride semiconductor material on the growth substrate.

At least in some embodiments, the present invention includes methods of depositing bulk III-nitride materials on growth substrates using HPVE processes without ex situ formation of nucleation template layers using MOCVD processes.

In some embodiments, the present invention includes methods of depositing bulk III-nitride semiconductor material on a growth substrate. A metal-nitride nucleation template layer is formed on a substrate using a non-metallorganic chemical vapor deposition (MOCVD) process in a first chamber to form the growth substrate, and the bulk III-nitride semiconductor material is deposited on the growth substrate using a halide vapor phase epitaxy (HVPE) process in a second chamber. Depositing the bulk III-nitride semiconductor material on the growth substrate may comprise flowing $NH_3$ and at least one of a metal trichloride and a metal tetrachloride toward the second chamber.

In additional embodiments of methods of depositing bulk III-nitride semiconductor material on a growth substrate, a metal-nitride nucleation template layer is formed on a substrate using a metallorganic chemical vapor deposition (MOCVD) process in a chamber to form the growth substrate, and the bulk III-nitride semiconductor material is deposited on the growth substrate using a halide vapor phase epitaxy (HVPE) process in the same chamber. Depositing the bulk III-nitride semiconductor material on the growth substrate using the halide vapor phase epitaxy (HVPE) process may comprise flowing $NH_3$ and at least one of a metal trichloride and a metal tetrachloride toward the same chamber.

In yet further embodiments of methods of depositing bulk III-nitride semiconductor material on a growth substrate, a metal-nitride nucleation template layer is formed on a substrate using a halide vapor phase epitaxy (HVPE) process in a chamber to form the growth substrate, and the bulk III-nitride semiconductor material is deposited on the growth substrate using a halide vapor phase epitaxy (HVPE) process in the same chamber. Depositing the bulk III-nitride semiconductor material on the growth substrate using the halide vapor phase epitaxy (HVPE) process may comprise flowing $NH_3$ and at least one of a metal trichloride and a metal tetrachloride toward the same chamber.

Additional embodiments of the invention include structures comprising bulk III-nitride semiconductor material that are formed using methods as disclosed herein.

BRIEF DESCRIPTION OF THE DRAWINGS

The present invention may be understood more fully by reference to the following detailed description of example embodiments of the present invention, which are illustrated in the appended figures in which.

DETAILED DESCRIPTION OF EMBODIMENTS OF THE INVENTION

Figure 1:
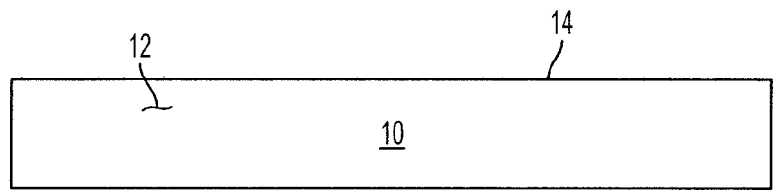
FIG. 1 is a simplified cross-sectional view of a substrate that may be employed in accordance with embodiments of methods of the invention.

The illustrations presented herein are not meant to be actual views of any particular component, device, or system, but are merely idealized representations which are employed to describe embodiments of the present invention.

A number of references are cited herein, none of the cited references, regardless of how characterized herein, is admitted as prior art relative to the invention of the subject matter claim herein.

As used herein, the term "III-V semiconductor material" means and includes any semiconductor material that is at least predominantly comprised of one or more elements from Group IIIA of the periodic table (B, Al, Ga, In, and Ti) and one or more elements from Group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, InGaNP, etc.

As used herein, the term "III-nitride semiconductor material" means and includes any III-V semiconductor material that is at least predominantly comprised of one or more elements from Group IIIA of the periodic table (B, Al, Ga, In, and Ti) and nitrogen. For example, III-nitride semiconductor materials include GaN, InN, AlN, InGaN, GaAlN, InAlN, etc.

As used herein, the term "metal-nitride" means a compound of metal and nitrogen. Metal-nitride materials include, but are not limited to, aluminum nitride (AlN), gallium nitride (GaN), aluminum gallium nitride ($Al_xGa_{1-x}N$), titanium nitride (TiN), hafnium nitride (HfN), chromium nitride (CrN), tungsten nitride (WN), and tantalum nitride (TaN).

As used herein, the terms "chemical vapor deposition" and "CVD" are synonymous and mean and include any process used to deposit solid material(s) on a substrate in a reaction chamber, in which the substrate is exposed to one or more reagent gases, which react, decompose, or both react and decompose in a manner that results in the deposition of the solid material(s) on a surface of the substrate.

As used herein, the terms "vapor phase epitaxy" and "VPE" are synonymous and mean and include any CVD process in which the substrate is exposed to one or more reagent vapors, which react, decompose, or both react and decompose in a manner that results in the epitaxial deposition of the solid material(s) on a surface of the substrate.

As used herein, the terms "halide vapor phase epitaxy" and "HVPE" are synonymous and mean and include any VPE process in which at least one reagent vapor used in the VPE process comprises a halide vapor.

As used herein, the term "metallorganic" means and includes any compound comprising at least one metallic element and an organic chemical species including at least one carbon-based ligand. Metallorganics are often referred to in the art as "organometallics," and such terms are synonymous for purposes of this disclosure. Metallorganics include, but are not limited to, trimethylgallium (TMG), triethylgallium (TEG), trimethylaluminum (TMA), triethylaluminum (TEA), tetrakisdiethylaminotitanium (TDEAT), and tetrakis (dimethylamido)titanium (TDMAT).

As used herein, the terms "metallorganic vapor phase epitaxy" and "MOVPE" are synonymous and mean and include any VPE process in which at least one reagent vapor used in the VPE process comprises a metallorganic vapor.

As used herein, the terms "non-metallorganic chemical vapor deposition process" and "non-MOCVD process" are synonymous and mean and include any deposition process that is not a MOCVD process.

As used herein, the terms "non-metallorganic vapor phase epitaxy process" and "non-MOVPE process" are synonymous and mean and include any deposition process that is not a MOVPE process.

As used herein, the term "gas" includes gases (fluids that have neither independent shape nor volume) and vapors (gases that include diffused liquid or solid matter suspended therein), and the terms "gas" and "vapor" are used synonymously herein.

Figure 2:
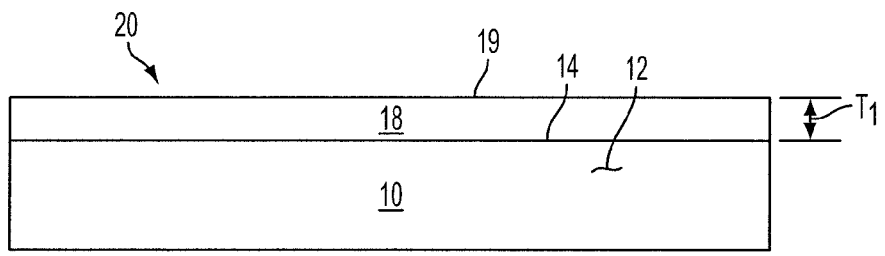
FIG. 2 is a simplified cross-sectional view of a growth substrate that may be employed in accordance with embodiments of methods of the invention, and that may be formed by depositing a nucleation template layer on the substrate of FIG. 1.
Figure 3:
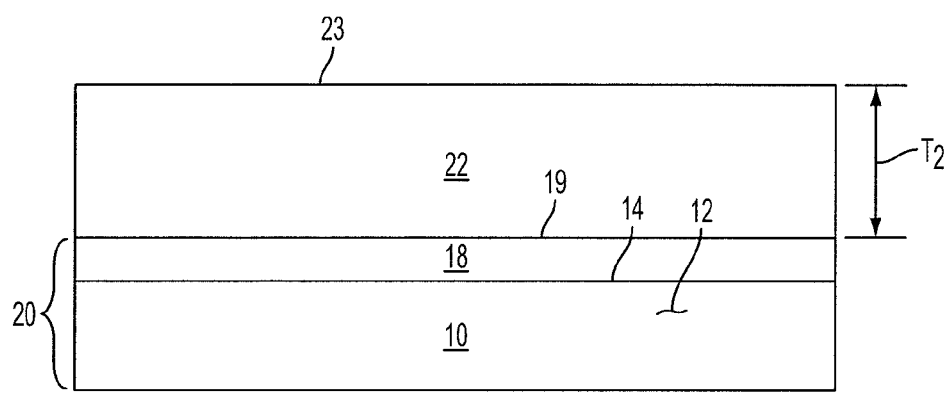
FIG. 3 is a simplified cross-sectional view of a structure that includes bulk III-nitride semiconductor material deposited over the nucleation template layer of the growth substrate of FIG. 2 in accordance with embodiments of methods of the invention.

FIGS. 1 through 3 illustrate the deposition of bulk III-nitride semiconductor material on a growth substrate in accordance with embodiments of the invention. Referring to FIG. 1, a substrate 10 is provided. The substrate 10 may be a generally planar, disc-shaped body, and may be generally circular, rectangular, etc. The substrate 10 may comprise what is referred to in the art as a "die" or "wafer." The substrate 10 may be at least substantially comprised of a homogenous material 12. The material 12 may comprise, for example, a ceramic such as an oxide (e.g., silicon dioxide ($SiO_2$) or aluminum oxide ($Al_2O_3$) (e.g., sapphire, which is $\alpha$-$Al_2O_3$)) or a nitride (e.g., silicon nitride ($Si_3N_4$) or boron nitride (BN)). As additional examples, the material 12 may comprise a semiconductor material such as silicon (Si), germanium (Ge), a III-V semiconductor material, etc. In some embodiments, the material 12 of the substrate 10 may be at least substantially comprised of a single crystal of the material 12. Furthermore, in such embodiments, the single crystal may have a selected crystallographic orientation, such that an exposed major surface 14 of the material 12 comprises a selected crystallographic plane of the single crystal of the material 12. As a non-limiting example, the substrate 10 may be selected to comprise a sapphire substrate. Such sapphire substrates are commercially available.

Referring to FIG. 2, a metal-nitride nucleation template layer 18 may be formed (e.g., deposited) on the exposed major surface 14 to form a growth substrate 20. In accordance with embodiments of methods of the invention, the metal-nitride nucleation template layer 18 may be formed on the substrate in several different ways, which are described in further detail below. By way of example and not limitation, the metal-nitride nucleation template layer 18 may be deposited on the exposed major surface 14 such that the template layer 18 has an average thickness $T_1$ of between about two nanometers (2 nm) and about five microns (5 μm).

The metal-nitride nucleation template layer 18 is employed to enable the deposition of bulk III-V semiconductor material over the substrate 10 to a desirable average total thickness while maintaining defect densities in the deposited bulk III-V semiconductor material at desirable concentrations. Due to differences between the crystal lattice structures of the material 12 of the substrate 10 and the bulk III-V semiconductor material that is to be deposited over the substrate 10 (which differences are often referred to in the art as "crystal lattice mismatch"), the crystal structure of the bulk III-V semiconductor material might contain relatively higher, undesirable concentrations of defects such as dislocations if the bulk III-V semiconductor material were to be directly deposited onto the exposed major surface 14 of the substrate 10. Thus, a metal-nitride nucleation template layer 18 is provided between the substrate 10, and the bulk III-V semiconductor material may have a composition and/or microstructure selected such that the metal-nitride nucleation template layer 18 has relatively lower crystal lattice mismatch with each of the substrate 10 and the bulk III-V semiconductor material to be deposited thereover relative to the crystal lattice mismatch between the substrate 10 and the bulk III-V semiconductor material. In other words, the nucleation template layer may be used to buffer the crystal lattice mismatch between the substrate 10 and the bulk III-V semiconductor material to be deposited thereover, and such nucleation template layers 18 are also referred to in the art as "buffer" layers. Further, the nucleation template layer 18 may be used as a seed layer to nucleate growth of the bulk III-V semiconductor material thereon, and such nucleation template layers 18 are also referred to in the art as "seed" layers.

Referring to FIG. 3, after forming the growth substrate 20, bulk III-V semiconductor material 22 may be nucleated and deposited onto an exposed major surface 19 of the metal-nitride nucleation template layer 18 using an HVPE process. Although a discrete boundary is visible between the metal-nitride nucleation template layer 18 and the bulk III-V semiconductor material 22 in the simplified drawing of FIG. 3, it is noted that the metal-nitride nucleation template layer 18 and the bulk III-V semiconductor material 22 may, in some embodiments, have at least substantially the same composition, and it may be difficult or impossible to visualize or otherwise identify any discrete boundary between the metal-nitride nucleation template layer 18 and the bulk III-V semiconductor material 22.

By way of example and not limitation, the bulk III-V semiconductor material 22 may be deposited over the growth substrate 20 to an average total thickness $T_2$ of at least about five microns (5 μm), at least about seven microns (7 μm), at least about ten microns (10 μm), at least about twenty microns (20 μm), or even at least about thirty microns (30 μm). The presence of the metal-nitride nucleation template layer 18 fabricated in accordance with embodiments of the present invention may enable the bulk III-V semiconductor material 22 to be deposited to such average total thicknesses $T_2$ while maintaining dislocation densities in the bulk III-V semiconductor material 22 at the exposed major surface 23 of the bulk III-V semiconductor material 22 at concentrations of about $5 \times 10^8$ per square centimeter or less.

Figure 4A:
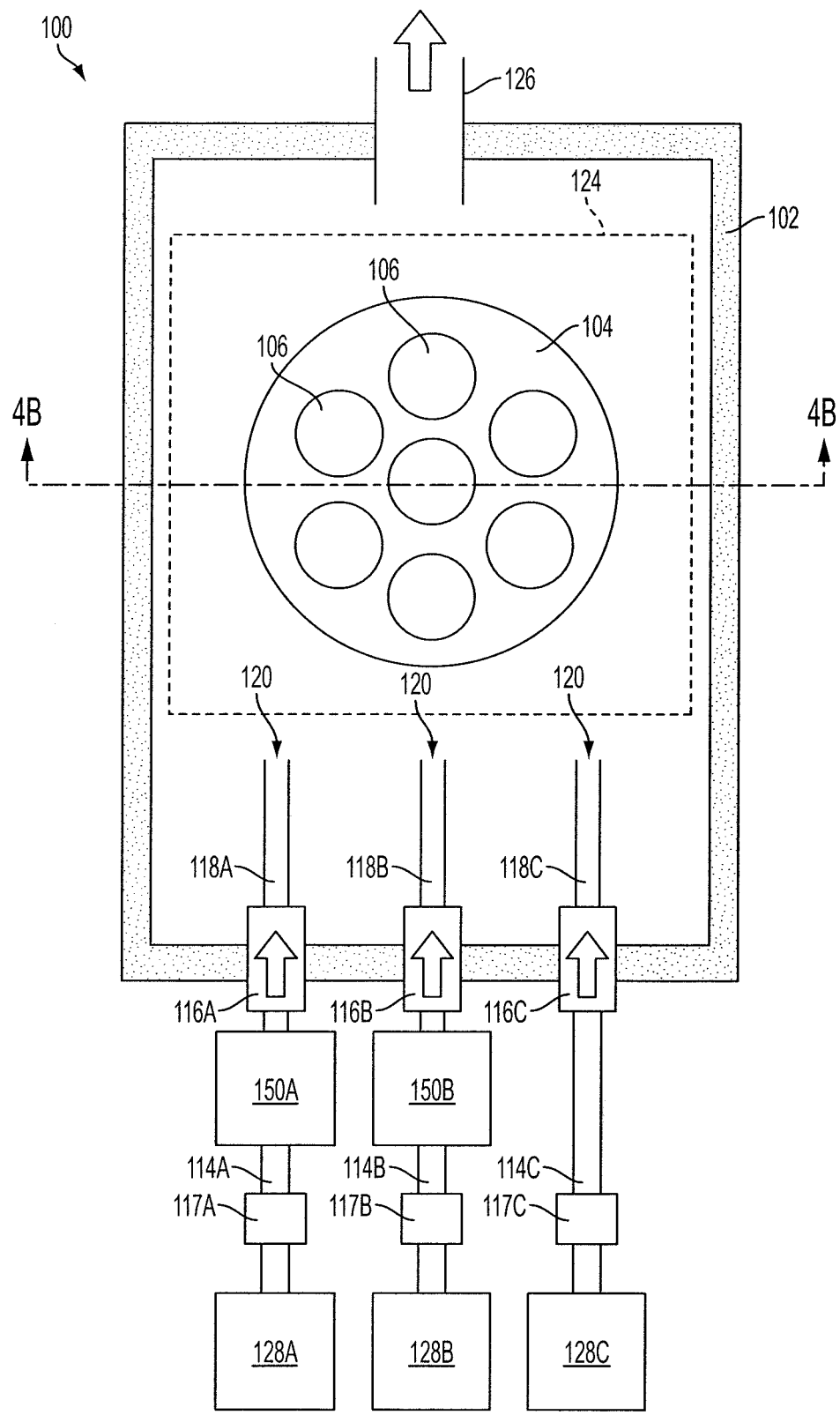
FIG. 4A is a cross-sectional view schematically illustrating an example embodiment of an HVPE deposition system that includes a reaction chamber and at least one gas injector, and that may be employed in embodiments of methods of the invention.
Figure 4B:
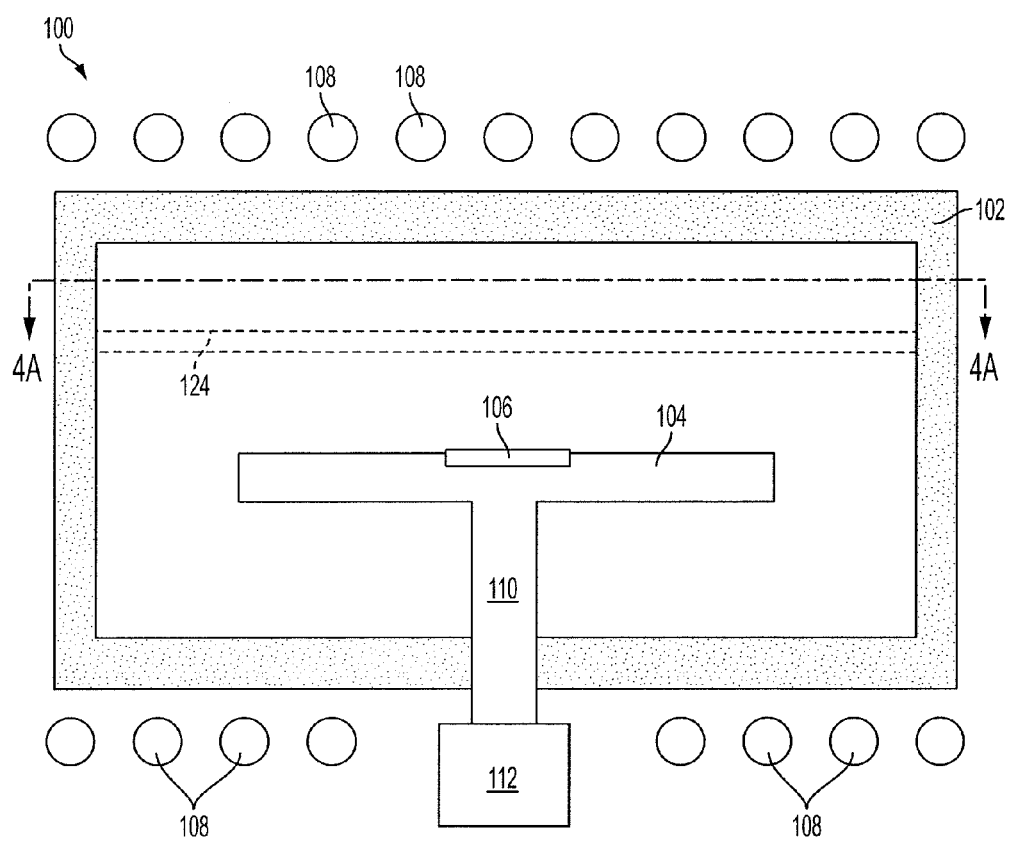
FIG. 4B is a schematic, cross-sectional view of the reaction chamber shown in FIG. 4A taken along section line 4B-4B shown therein.

FIGS. 4A and 4B are simplified illustrations schematically illustrating an embodiment of an HVPE deposition system 100 that may be employed in embodiments of methods of the invention, as described herein. As non-limiting examples, the deposition system 100 may comprise a deposition system as described in any of U.S. Patent Application Publication No. US 2009/0223442 A1, which published Sep. 10, 2009 in the name of Arena et al., U.S. Provisional Patent Application Ser. No. 61/157,112, which was filed Mar. 3, 2009 in the name of Arena et al., and U.S. patent application Ser. No. 12/894,724, which was filed Sep. 30, 2010 in the name of Bertran. The deposition system 100 shown in FIGS. 4A and 4B includes a reaction chamber 102 and one or more gas injectors (as described in further detail below).

In the following description of the deposition system 100 and, more particularly, the reaction chamber 102 of the deposition system 100, the terms "longitudinal" and "transverse" are used to refer to the directions relative to the reaction chamber 102 from the perspectives of FIGS. 4A and 4B, wherein the longitudinal direction is the vertical direction from the perspective of FIG. 4A and the direction extending into the plane of FIG. 4B, and the transverse or lateral directions are those extending horizontally from the perspective of each of FIGS. 4A and 4B. The transverse directions are also referred to as directions extending "across the reactor."

The deposition system 100 includes the reaction chamber 102, a substrate support structure 104 (e.g., a susceptor) configured to support one or more workpiece substrates 106 (which, may initially comprise a substrate 10 as shown in FIG. 1 or a growth substrate 20 as shown in FIG. 2) on which it is desired to deposit or otherwise provide material within the deposition system 100. By way of non-limiting example, the reaction chamber 102 may have a height of about two inches, a width of about twelve inches, and a length of about twenty inches, and the substrate support structure 104 may be configured to support one eight-inch workpiece substrate 106, one six-inch workpiece substrate 106, three four-inch workpiece substrates 106, or eight two-inch workpiece substrates 106. The deposition system 100 further includes heating elements 108 (FIG. 4B), which may be used to selectively heat the deposition system 100 such that an average temperature within the reaction chamber 102 may be controlled to within desirable elevated temperatures during deposition processes. The heating elements 108 may comprise, for example, resistive heating elements or radiant heating elements.

As shown in FIG. 4B, the substrate support structure 104 may be mounted on a spindle 110, which may be coupled (e.g., directly structurally coupled, magnetically coupled, etc.) to a drive device 112, such as an electrical motor that is configured to drive rotation of the spindle 110 and, hence, the substrate support structure 104 within the reaction chamber 102.

In some embodiments, one or more of the reaction chamber 102, the substrate support structure 104, the spindle 110, and any other components within the reaction chamber 102 may be at least substantially comprised of a refractory ceramic material such as a ceramic oxide (e.g., silica (quartz), alumina, zirconia, etc.), a carbide (e.g., silicon carbide, boron carbide, etc.), or a nitride (e.g., silicon nitride, boron nitride, etc.).

The deposition system 100 further includes a gas flow system used to inject one or more gases into the reaction chamber 102 and to exhaust gases out from the reaction chamber 102. Referring to FIG. 4A, the deposition system 100 may include three gas inflow conduits 114A, 114B, 114C that carry gases from respective gas sources 128A, 128B, 128C. Optionally, devices 117A, 117B, 117C, which may comprise one or more of valves, back pressure regulators, and mass flow controllers, may be used to selectively control the flow of gas through the gas inflow conduits 114A, 114B, 114C, respectively.

In some embodiments, at least one of the gas sources 128A, 128B may comprise an external source of a metal trichloride such as $GaCl_3$, $InCl_3$, or $AlCl_3$, as described in U.S. Patent Application Publication No. US 2009/0223442 A1. $GaCl_3$, $InCl_3$ and $AlCl_3$ may exist in the form of a dimer such as, for example, $Ga_2Cl_6$, $In_2Cl_6$ and $Al_2Cl_6$, respectively. Thus, at least one of the gas sources 128A, 128B may comprise a dimer such as $Ga_2Cl_6$, $In_2Cl_6$ or $Al_2Cl_6$. As a non-limiting example, one or more of the gas sources 128A, 128B may provide a mass flow of $GaCl_3$ vapor as a Group IIIA precursor component. The gas source 128C may comprise an external source of a Group VA precursor, such as ammonia ($NH_3$).

In embodiments in which one or more of the gas sources 128A, 128B is or includes a $GaCl_3$ source, the $GaCl_3$ source includes a reservoir of liquid $GaCl_3$ maintained at a temperature of at least 120° C. (e.g., approximately 130° C.), and may include physical means for enhancing the evaporation rate of the liquid $GaCl_3$. Such physical means may include, for example, a device configured to agitate the liquid $GaCl_3$, a device configured to spray the liquid $GaCl_3$, a device configured to flow carrier gas rapidly over the liquid $GaCl_3$, a device configured to bubble carrier gas through the liquid $GaCl_3$, a device, such as a piezoelectric device, configured to ultrasonically disperse the liquid $GaCl_3$, and the like. As a non-limiting example, a carrier gas, such as He, $N_2$, $H_2$, or Ar, or a mixture thereof (e.g., a mixture of $N_2$ and $H_2$) may be bubbled through the liquid $GaCl_3$, while the liquid $GaCl_3$ is maintained at a temperature of at least 120° C., such that the source gas may include one or more carrier gases.

The flux of the $GaCl_3$ vapor into one or more of the gas injectors 150A, 150B may be controlled in some embodiments of the invention. For example, in embodiments in which a carrier gas is bubbled through liquid $GaCl_3$, the $GaCl_3$ flux from the gas source 128A, 128B, 128C is dependent on one or more factors, including, for example, the temperature of the $GaCl_3$, the pressure over the $GaCl_3$, and the flow of carrier gas that is bubbled through the $GaCl_3$. While the mass flux of $GaCl_3$ can, in principle, be controlled by any of these parameters, in some embodiments, the mass flux of $GaCl_3$ may be controlled by varying the flow of the carrier gas using a mass flow controller.

In some embodiments, the temperatures of the gas inflow conduits 114A, 114B may be controlled between the gas sources 128A, 128B and the gas injectors 150A, 150B. The temperatures of the gas inflow conduits 114A, 114B and associated mass flow sensors, controllers, and the like may increase gradually from a first temperature (e.g., about 120° C. or more) at the exit from the respective gas sources 128A, 128B up to a second temperature (e.g., about 160° C. or less) at the gas injectors 150A, 150B in order to prevent condensation of the gases (e.g., $GaCl_3$ vapor) in the gas inflow conduits 114A, 114B and the like. Optionally, the length of the gas inflow conduits 114A, 114B between the respective gas sources 128A, 128B and the gas injectors 150A, 150B may be about three feet or less, about two feet or less, or even about one foot or less. The pressure of the source gases may be controlled using one or more pressure control systems.

Each of the two gas inflow conduits 114A, 114B optionally may extend to a respective one of two gas injectors 150A, 150B, which are described in further detail below.

In additional embodiments, the deposition system 100 may include less than two (i.e., one) gas inflow conduits and respective gas injectors, or the deposition system 100 may include more than two (e.g., three, four, five, etc.) gas inflow conduits and respective gas injectors.

In the embodiment of FIGS. 4A and 4B, the gas injectors 150A, 150B are located entirely outside the reaction chamber 102. In other embodiments, however, the gas injectors 150A, 150B may be disposed entirely within the reaction chamber 102, or at least a portion of the gas injectors 150A, 150B may extend at least partially through the reaction chamber 102.

The deposition system 100 may further include three gas ports 116A, 116B, 116C that provide fluid communication between the exterior and the interior of the reaction chamber 102. Each of the gas ports 116A, 116B, 116C may provide fluid communication through one or more of a wall, the ceiling or the floor of the reaction chamber 102 between a respective one of the gas injectors 150A, 150B and a respective gas dispersion conduit 118A, 118B, 118C within the reaction chamber 102.

The gas dispersion conduits 118A, 118B, 118C within the reaction chamber 102 may be used to carry the gases to desirable locations within the enclosure. The gas dispersion conduits 118A, 118B, 118C may be located and configured to inject gases into the interior of the reaction chamber 102 in selected directions relative to the workpiece substrates 106 carried upon the substrate support structure 104. Gases carried by the gas dispersion conduits 118A, 118B, 118C, such as precursor gases and carrier gases, may flow in the longitudinal direction through the reaction chamber 102 (the vertical direction from the perspective of FIG. 4A) and may be injected out therefrom in directions extending toward the workpiece substrates 106 longitudinally within the reaction chamber 102, the directions being oriented at least substantially parallel to upper exposed major surfaces of the workpiece substrates 106. The gas dispersion conduits 118A, 118B, 118C may be supported and held in place within the reaction chamber 102 using conduit support fixtures.

The particular layout and configuration of the gas dispersion conduits 118A, 118B, 118C is merely one of many layouts and configurations that may be used in embodiments of the invention, and additional embodiments of reaction chambers 102 may have different configurations and layouts of gas dispersion conduits within the reaction chamber 102.

The gas dispersion conduits 118A, 118B, 118C may be actively heated, passively heated, or both passively and actively heated. For example, heat producing elements (not shown) may be positioned adjacent to at least a portion of the gas dispersion conduits 118A, 118B, 118C. In some embodiments, the gas dispersion conduits 118A, 118B, 118C are heated by the heating elements 108 (FIG. 4B). Optionally, passive heat transfer structures (e.g., structures comprising materials that behave similarly to a black body) may be located adjacent or proximate to at least a portion of the gas dispersion conduits 118A, 118B, 118C within the reaction chamber 102 to improve transfer of heat to the gas dispersion conduits 118A, 118B, 118C.

Passive heat transfer structures (e.g., structures comprising materials that behave similarly to a black body) may be provided within the reaction chamber 102 as disclosed in, for example, U.S. Patent Application Publication No. US 2009/0214785 A1, which published on Aug. 27, 2009 in the name of Arena et al. For example, a heat transfer plate 124 (represented in FIGS. 4A and 4B by a dashed line) may be positioned within the reaction chamber 102 such that the heat transfer plate 124 extends across the reaction chamber 102 over the substrate support structure 104 and the workpiece substrates 106 supported by the substrate support structure 104. The heat transfer plate 124 may aid in thermalizing process gases flowing in proximity to the heat transfer plate 124 by absorbing radiation from heating elements (such as the heating elements 108), and reradiating the absorbed heat into the process gases.

Such a passive heat transfer structure may improve the transfer of heat within the interior of the reaction chamber 102, and may improve the homogeneity and consistency of the temperature within the reaction chamber 102. The passive heat transfer structures may comprise materials with high emissivity values (close to unity) (black body materials) that are also capable of withstanding the high temperature, corrosive environments that may be encountered within the deposition system 100. Such materials may include, for example, aluminum nitride (AlN), silicon carbide (SiC), and boron carbide ($B_4C$), which have emissivity values of 0.98, 0.92, and 0.92, respectively.

Gaseous byproducts, carrier gases, and any excess precursor gases may be exhausted out from the reaction chamber 102 through a chamber outlet 126.

As previously mentioned, one or more of the gas injectors 150A, 150B of the deposition system 100 of FIGS. 4A and 4B may be or include a gas injector as described in further detail below with reference to FIGS. 5 through 7.

In some embodiments, the gas injectors 150A, 150B may comprise gas injectors as disclosed in International Publication Number WO 2010/101715 A1, which published Sep. 10, 2010 in the name of Arena et al. For example, FIG. 5 is a perspective view of a thermalizing gas injector 160, which may be used for one or both of the gas injectors 150A, 150B shown in FIG. 4A. As shown in FIG. 5, the gas injector 160 includes a conduit 162, which includes an inlet portion 164, a coiled central portion 166, and an outlet portion 168. A source gas (e.g., $GaCl_3$), a carrier gas (e.g., $H_2$, $N_2$, etc.), or a mixture of a source gas and a carrier gas, may be supplied to the inlet portion 164. The gas or gases flow from the inlet portion 164, through the coiled central portion 166, out through the outlet portion 168 and into the reaction chamber 102 (FIG. 4A). At least the coiled central portion 166 of the conduit 162 may be heated, as discussed in further detail below. By coiling the conduit 162, a length of the physical space occupied by the conduit 162 is significantly less than the actual length of the flow path through the conduit 162. Stated another way, a length of the conduit 162 may be longer than a shortest distance between the inlet portion 164 and the outlet portion 168. The conduit 162 may have other configurations. For example, the conduit 162 may have a serpentine configuration that includes a plurality of generally parallel straight sections connected together in an end-to-end fashion by curved sections that extend through an angle of 180°.

The conduit 162 may be configured to heat the gas flowing through the conduit 162 for a desirable amount of time (i.e., a residence time), which may be a function of the cross-sectional area of the flow path within the conduit 162, the flow rate of the source gas through the conduit 162, and the overall length of the conduit 162. The conduit 162 may be shaped and configured to be located proximate to one or more active or passive heating elements, as discussed in further detail below.

Figure 5:
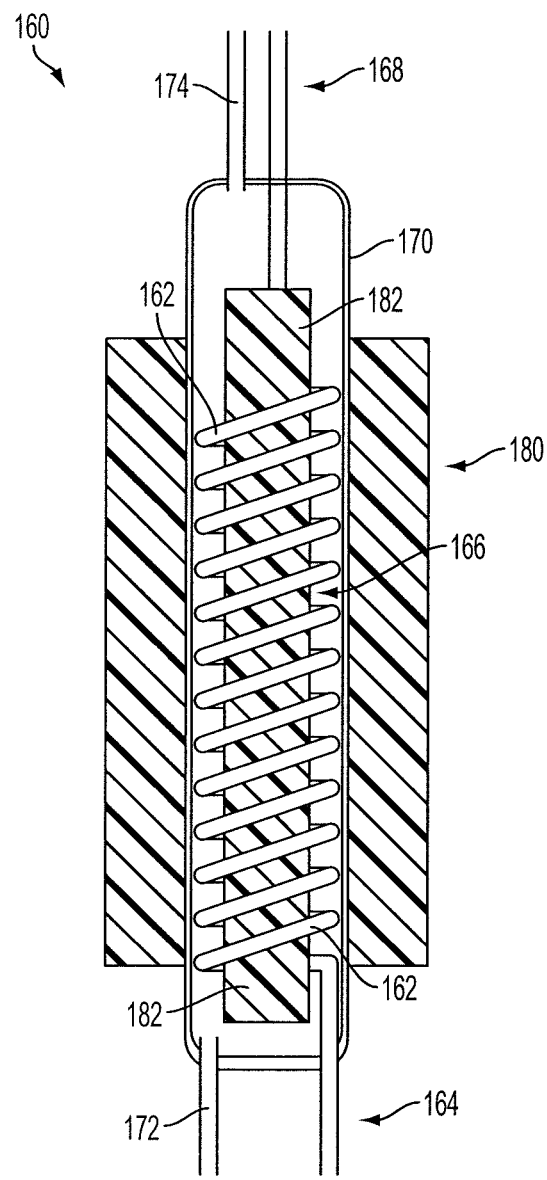
FIG. 5 schematically illustrates an embodiment of a thermalizing gas injector that may be employed in the deposition system of FIG. 4A.

As shown in FIG. 5, at least the coiled central portion 166 of the conduit 162 may be contained within an outer housing 170. The outer housing 170 also may serve as an additional gas-conducting conduit for gases such as purge gases. For example, as shown in FIG. 5, the outer housing 170 may comprise a housing inlet 172 and a housing outlet 174. Purge gas may be caused to flow through the outer housing 170 from the housing inlet 172 to the housing outlet 174. The purge gas may be heated by the thermalizing gas injector 160 as it passes through the outer housing 170.

The conduit 162 and the outer housing 170 may comprise a refractory material that is stable and inert at elevated temperatures to which they are subjected during use. For example, the conduit 162 and the outer housing 170 may be formed from and at least substantially comprised of quartz.

The thermalizing gas injector 160 may be heated using active heat producing elements positioned proximate (e.g., adjacent) to one or more of the outer housing 170 and the coiled central portion 166 of the conduit 162. Active heating elements include radiation emitting elements such as heat lamps, inductive heating elements, electrical heating elements such as resistive heating elements, and so forth. The thermalizing gas injector 160 may also include passive heating elements that do not generate heat themselves, but that are used to redistribute, reflect, or otherwise affect heat transfer in and around the thermalizing gas injector 160. For example, as shown in FIG. 5, the thermalizing gas injector 160 may include an active heating element 180, which may comprise a resistively heated clamp-shell heater that at least partially surrounds the exterior of the outer housing 170. Thus, gases flowing through the conduit 162 and/or the outer housing 170 may be heated by the active heating element 180. As shown in FIG. 5, an optional heating element 182, which may be active or passive, may be disposed within the outer housing 170. The heating element 182 may have an elongated cylindrical shape, and the coiled central portion 166 of the conduit 162 may be coiled around the heating element 182, as shown in FIG. 5. By way of example and not limitation, the heating element 182 may comprise a rod comprising a black body material that is used to re-distribute heat generated by the active heating element 180. The presence of the heating element 182 may improve the efficiency by which the gases within the coiled central portion 166 of the conduit 162 and the gases within the outer housing 170 are heated by the active heating element 180.

In embodiments of the invention in which the source gas supplied to the thermalizing gas injector 160 by one of the gas sources 128A, 128B comprises a metal trichloride such as $GaCl_3$ and hydrogen carrier gas $H_2$, the metal trichloride and the hydrogen gas may decompose to form a metal monochloride vapor such as GaCl and HCl vapor, which vapors may be passed out the outlet portion 168 of the conduit 162 and to the reaction chamber 102.

In additional embodiments, the gas injectors 150A, 150B may comprise gas injectors as disclosed in U.S. patent application Ser. No. 12/894,724, now U.S. Pat. No. 8,486,192, issued Jul. 16, 2013 to Bertram. For example, gas injectors 150A, 150B may comprise a reservoir configured to hold a liquid metal or other element, such as, for example, liquid gallium (Ga), liquid aluminum (Al), or liquid indium (In), or an organometallic substance such as trimethylgallium (TMG), triethylgallium (TEG), trimethylaluminum (TMA), triethylaluminum (TEA), tetrakisdiethylaminotitanium (TDEAT), and tetrakis(dimethylamido)titanium (TDMAT). In further embodiments, the reservoir may be configured to hold a solid reagent for reacting with a source gas (or a decomposition or reaction product of a source gas). For example, the reservoir may be configured to hold a solid volume of one or more materials, such as, for example, solid silicon (Si) or solid magnesium (Mg).

Figures 6, 7:
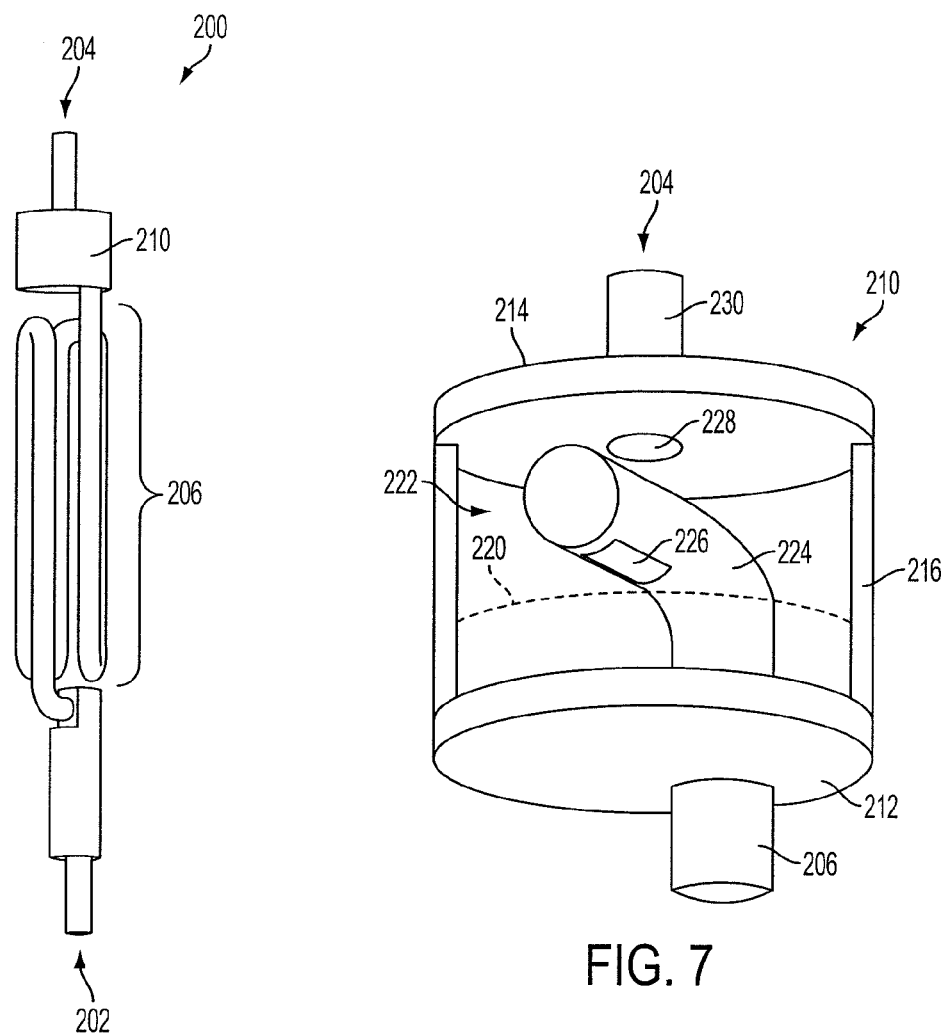
FIG. 6 schematically illustrates another example embodiment of a gas injector that may be employed in the deposition system of FIG. 4A.
FIG. 7 is an enlarged, partially cut-away view of a portion of the gas injector of FIG. 6.

FIG. 6 is a perspective view of a gas injector 200, which may be used for one or both of the gas injectors 150A, 150B shown in FIG. 4A. As shown in FIG. 6, the gas injector 200 includes an inlet 202, an outlet 204, a thermalizing conduit 206, and a container 210. The container 210 is configured to hold a liquid reagent therein. For example, a liquid metal such as liquid gallium, liquid indium, liquid aluminum, etc., or a liquid organometallic substance, may be disposed within the container 210. A source gas (e.g., $GaCl_3$), a carrier gas (e.g., $H_2$, $N_2$, etc.), or a mixture of a source gas and a carrier gas, may be supplied to the inlet 202. The gas or gases may flow from the inlet 202 into the thermalizing conduit 206. The thermalizing conduit 206 may be configured to heat the gas flowing through the thermalizing conduit 206 for a desirable amount of time (i.e., a residence time), which may be a function of the cross-sectional area of the flow path within the thermalizing conduit 206, the flow rate of the source gas through the thermalizing conduit 206, and the overall length of the thermalizing conduit 206. The thermalizing conduit 206 may be shaped and configured to be located proximate to one or more active or passive heating elements, as discussed in further detail below.

Furthermore, the thermalizing conduit 206 may include one or more curved sections or turns, such that the length of the physical space occupied by the thermalizing conduit 206 is significantly less than the actual length of the flow path through the thermalizing conduit 206. Stated another way, a length of the thermalizing conduit 206 may be longer than a shortest distance between the inlet 202 and the liquid container 210. In some embodiments, the length of the thermalizing conduit 206 may be at least about twice the shortest distance between the inlet 202 and the liquid container 210, at least about three times the shortest distance between the inlet 202 and the liquid container 210, or even at least about four times the shortest distance between the inlet 202 and the liquid container 210. For example, the thermalizing conduit 206 may have a serpentine configuration, as shown in FIG. 6, which includes a plurality of generally parallel straight sections connected together in an end-to-end fashion by curved sections that extend through an angle of 180°.

The thermalizing conduit 206 may comprise a tube that is at least substantially comprised of a refractory material such as, for example, quartz.

In some embodiments, the gas may comprise a source gas that at least partially decomposes within the thermalizing conduit 206. For example, in embodiments in which the gas comprises a source gas of $GaCl_3$ and a carrier gas comprising $H_2$, the source gas may decompose to form gaseous GaCl and hydrogen chloride (HCl).

The gases flow from the thermalizing conduit 206 into the container 210. FIG. 7 is an enlarged, partially cut-away view of the container 210. As shown in FIG. 7, the container 210 includes a bottom wall 212, a top wall 214, and at least one side wall 216. In the embodiment of FIGS. 6 and 7, the reservoir has a generally cylindrical shape, such that each of the bottom wall 212 and the top wall 214 has a circular shape and is at least substantially planar, and such that the side wall 216 is at least substantially cylindrical (e.g., tubular). In additional embodiments of the invention, the reservoir may be configured in alternative geometrical configurations. The bottom wall 212, the top wall 214, and the at least one side wall 216 together define a hollow body, the interior of which defines a reservoir for holding a liquid reagent, such as liquid gallium or an organometallic substance.

The interior space within the hollow container 210 may be partially filled with a liquid reagent. For example, the container 210 may be filled with a liquid reagent to the level indicated by the dashed line 220 in FIG. 7, such that a void or space 222 is present over the liquid reagent within the container 210. Gases flowing out from the thermalizing conduit 206 may be injected into the space 222 over the liquid reagent within the container 210. As a non-limiting example, the gases flowing out from the thermalizing conduit 206 may flow through the bottom wall 212 into a tube 224. In some embodiments, the tube 224 may comprise an integral portion of the thermalizing conduit 206 that extends into the container 210. The tube 224 may extend through the liquid reagent disposed within the liquid container to the space 222 over the liquid reagent. The tube 224 may comprise a ninety degree bend, such that an end portion of the tube 224 extends horizontally over the liquid reagent.

As shown in FIG. 7, an aperture may be provided through the cylindrical sidewall of the tube 224 on a side thereof facing the surface of the liquid reagent, such that gases flowing through the tube 224 will exit the tube 224 through the aperture 226. The gases exiting the aperture 226 may be directed out from the aperture 226 in a direction oriented toward the surface of the liquid reagent to promote reaction between one or more components of the gases and the liquid reagent. For example, in embodiments in which the source gas comprises $GaCl_3$ carried within a carrier gas such as $H_2$, and the source gas has decomposed to include gaseous GaCl and a chlorinated species such as, for example, hydrogen chloride (HCl) within the thermalizing conduit 206, the liquid reagent within the liquid container may comprise liquid gallium, which may react with the chlorinated gas (e.g., HCl) generated within the thermalizing conduit 206 to form additional gaseous GaCl. The gases within the space 222 over the liquid reagent within the container 210 may flow out from the container through an outlet port 228. For example, the outlet port 228 may be located in the top wall 214 of the container 210 over the horizontally extending portion of the tube 224. The outlet port 228 may lead to an outlet conduit 230, the end of which may define the outlet 204 of the gas injector 200.

In additional embodiments, the gases flowing out from the thermalizing conduit 206 may be injected into the liquid reagent within the container 210, such that the gases are bubbled up through the liquid reagent into the space 222 over the liquid reagent.

The various components of the container 210 may be at least substantially comprised of a refractory material such as, for example, quartz.

The GaCl may be a desirable precursor gas for forming GaN. Thus, by converting the excess chlorinated species such as, for example, hydrogen chloride gas (HCl) that results from thermal decomposition of $GaCl_3$ and $H_2$ (in systems that employ a source gas comprising $GaCl_3$ and $H_2$) into additional GaCl, detrimental effects of excess chlorinated species to the deposited GaN material may be avoided, since the amount of chlorinated species entering the reaction chamber 102 may be reduced. Such detrimental effects may include, for example, incorporation of chlorine atoms into the gallium nitride crystal lattice and cracking or delamination of the deposited GaN film. In introducing excess hydrogen chloride gas (HCl) into the reaction chamber may result in the hydrogen chloride acting as an etchant to the GaN within the reaction chamber, thereby reducing the growth rate or even preventing growth of the GaN. Furthermore, by reacting the excess chlorinated species with the liquid gallium to form additional GaCl, the efficiency of the deposition system 100 may be improved.

Figure 8:
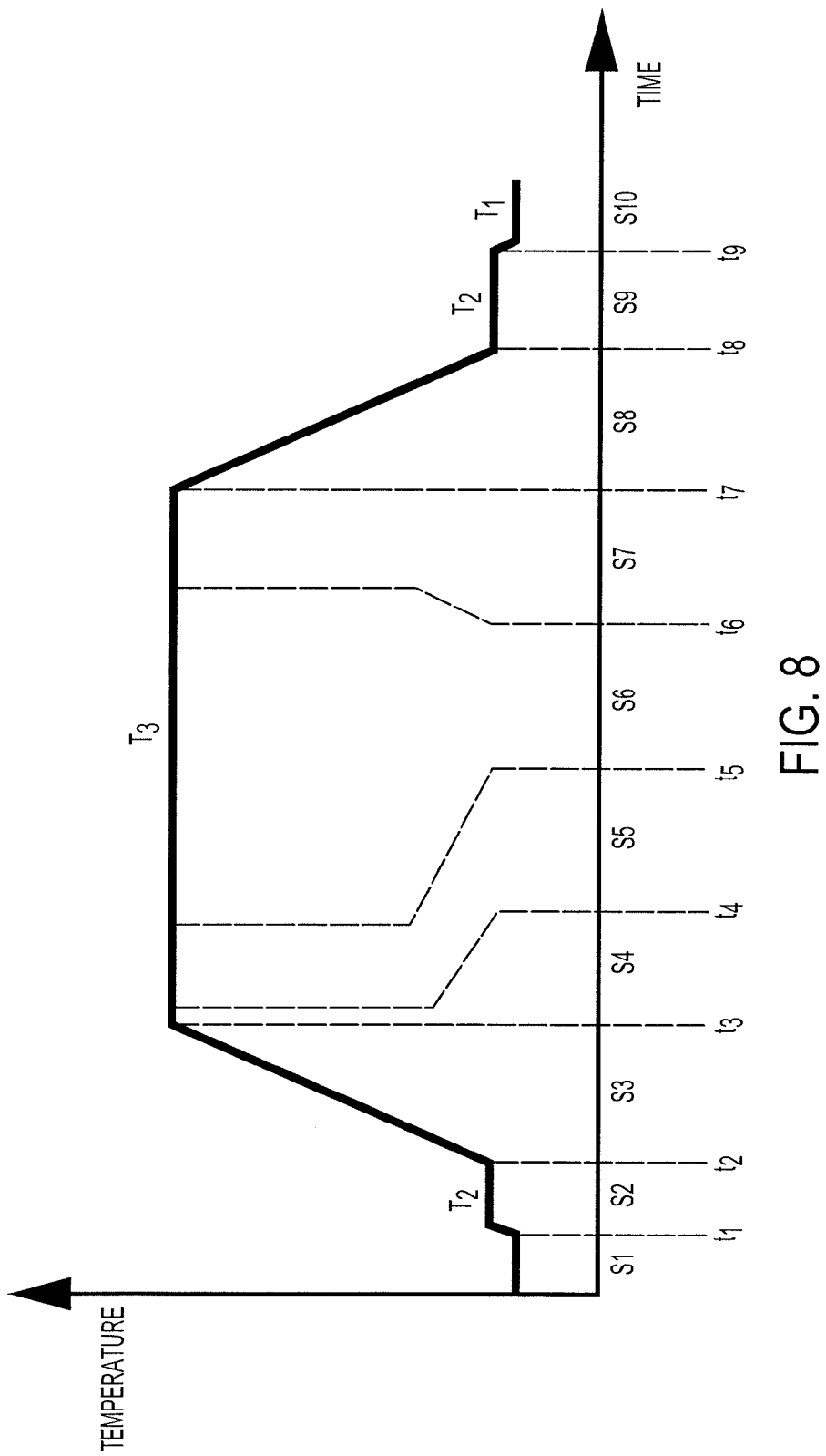
FIG. 8 is a graph schematically representing a deposition process that may be used to deposit bulk III-nitride semiconductor material over a growth substrate in accordance with embodiments of the invention and using an HVPE deposition system like that shown in FIGS. 4A and 4B.

The HVPE deposition system 100 described above with reference to FIGS. 4A and 4B may be used to deposit the bulk III-nitride semiconductor material 22 over a growth substrate 20 in accordance with embodiments of the invention, as previously described with reference to FIG. 3. FIG. 8 is a graph schematically representing a non-limiting example of an HVPE deposition process that may be used to deposit the bulk III-nitride semiconductor material 22 over a growth substrate 20 using the deposition system 100 of FIGS. 4A and 4B. The deposition process shown in FIG. 8 is provided as an example, and other HVPE deposition processes also may be used to deposit the bulk III-nitride semiconductor material 22 over a growth substrate 20 (FIG. 3).

Referring to FIG. 8, the example deposition process is represented by plotting temperature T in the reaction chamber 102 as a function of time t. As shown in the graph, the deposition process includes ten (10) stages, which are sequentially labeled S1 through S10. Non-limiting example process parameters of the deposition process throughout each of the ten stages S1 through S10 are provided in Table 1 below.

TABLE 1

| Stage | Description | Temp. | Time Period | Pressure | Group III Source | Group V Source | Purge Gas |
|---|---|---|---|---|---|---|---|
| S1 | Load | 350° C. | — | Atm. | — | — | $N_2$ 10 slm |
| S2 | Stabilization | 400° C. | 30 sec | 200 Torr | — | — | $N_2$ 15 slm $H_2$ 2 slm |
| S3 | Ramp | — | 4.5 min | 200 Torr | — | $NH_3$ 1 slm | $N_2$ 23 slm $H_2$ 16 slm |
| S4 | Stabilization | 1025° C. | 30 sec | 200 Torr | — | $NH_3$ 18 slm | $N_2$ 23 slm $H_2$ 5 slm |
| S5 | 1st Deposition | 1025° C. | 5.0 min | 200 Torr | $N_2$ 2.5 slm $H_2$ 0.8 slm $GaCl_3$ 51 sccm | $NH_3$ 18 slm | $N_2$ 23 slm $H_2$ 5 slm |
| S6 | 2nd Deposition | 1025° C. | 20.0 min | 200 Torr | $N_2$ 2.5 slm $H_2$ 1.2 slm $GaCl_3$ 80 sccm | $NH_3$ 18 slm | $N_2$ 23 slm $H_2$ 5 slm |
| S7 | Anneal | 1025° C. | 10.0 min | 200 Torr | — | $NH_3$ 14 slm | $N_2$ 23 slm $H_2$ 5 slm |
| S8 | Ramp | — | 4.5 min | 200 Torr | — | $NH_3$ 14 slm | $N_2$ 23 slm $H_2$ 12 slm |
| S9 | Purge | 400° C. | 5.0 min | Atm. | — | — | $N_2$ 16 slm |
| S10 | Unload | 350° C. | — | Atm. | — | — | $N_2$ 10 slm |

As shown in FIG. 8 and Table 1, stage S1 is a loading stage during which the workpiece substrates 106 are loaded onto the substrate support structure 104. After loading the workpiece substrates 106 onto the substrate support structure 104, the reaction chamber 102 is heated to a temperature $T_1$ of 350° C. at atmospheric pressure while flowing a purge gas comprising $N_2$ through the reaction chamber 102 at a flow rate of 10 standard liters per minute (slm).

As shown in FIG. 8, the stabilization stage S2 commences at time $t_1$ and extends for a duration of 30 sec. During the stabilization stage S2, the reaction chamber 102 is heated to a temperature $T_2$ of 400° C. at a pressure of 200 Torr while flowing a purge gas through the reaction chamber 102. The purge gas comprises $N_2$ at a flow rate of 15 slm and $H_2$ at a flow rate of 2 slm.

The ramp stage S3 commences at time at time $t_2$ and extends for a duration of 4.5 min. During the ramp stage S3, the reaction chamber 102 is heated steadily and continuously at a substantially constant ramp rate from temperature $T_2$ to a temperature $T_3$ of 1025° C. The pressure within the reaction chamber 102 is maintained at 200 Torr during ramp stage S3. During the ramp stage S3, Group V source gas comprising NH$_3$ is flown through the reaction chamber 102 at a flow rate of 1 slm, and a purge gas comprising N$_2$ at a flow rate of 23 slm and H$_2$ at a flow rate of 16 slm is passed through the reaction chamber 102.

The stabilization stage S4 commences at time at time t$_3$ and extends for a duration of 30 sec. During the stabilization stage S4, the reaction chamber 102 is maintained at the temperature T$_3$ of 1025° C. and a pressure of 200 Torr. During the stabilization stage S4, Group V source gas comprising NH$_3$ is flown through the reaction chamber 102 at a flow rate of 18 slm, and a purge gas comprising N$_2$ at a flow rate of 23 slm and H$_2$ at a flow rate of 5 slm is passed through the reaction chamber 102.

The 1st deposition stage S5 commences at time at time t$_4$ and extends for a duration of 5.0 min During the deposition stage S5, the reaction chamber 102 is maintained at the temperature T$_3$ of 1025° C. and a pressure of 200 Torr. During the deposition stage S5, Group III source gas comprising GaCl$_3$ is flown through the reaction chamber at a flow rate of 51 standard cubic centimeters per minute (sccm) with a carrier gas comprising N$_2$ at a flow rate of 2.5 slm and H$_2$ at a flow rate of 0.8 slm. Group V source gas comprising NH$_3$ is flown through the reaction chamber 102 at a flow rate of 18 slm. A purge gas comprising N$_2$ at a flow rate of 23 slm and H$_2$ at a flow rate of 5 slm is also flown through the reaction chamber 102.

The 2nd deposition stage S6 commences at time at time t$_5$ and extends for a duration of 20.0 min. The reaction chamber 102 is maintained at the temperature T$_3$ of 1025° C. and a pressure of 200 Torr during the 2nd deposition stage S6. The flow rate of the GaCl$_3$ Group III source gas is increased to 80 sccm during the deposition stage S6, the GaCl$_3$ being carried by the carrier gas comprising N$_2$ at a flow rate of 2.5 slm and H$_2$ at a flow rate of 1.2 slm. Group V source gas comprising NH$_3$ is flown through the reaction chamber 102 at a flow rate of 18 slm. A purge gas comprising N$_2$ at a flow rate of 23 slm and H$_2$ at a flow rate of 5 slm is also flown through the reaction chamber 102 during the 2nd deposition stage S6.

During at least one of the 1st deposition stage S5 and the 2nd deposition stage S6, the bulk III-nitride semiconductor material 22 may be deposited over the growth substrate 20 in the HVPE process at a rate of at least about ten microns (10 µm) per hour, or even at a rate of at least about twenty microns (20 µm) per hour. Such deposition rates may be significantly higher than deposition rates that may be attached through use of MOCVD processes for deposition of bulk III-nitride semiconductor materials.

The annealing stage S7 commences at time t$_6$ and extends for a duration of 20.0 min During the annealing stage S7, the reaction chamber 102 is maintained at the temperature T$_3$ of 1025° C. and a pressure of 200 Torr. During the annealing stage S7, Group V source gas comprising NH$_3$ is flown through the reaction chamber 102 at a flow rate of 14 slm, and a purge gas comprising N$_2$ at a flow rate of 23 slm and H$_2$ at a flow rate of 5 slm is passed through the reaction chamber 102.

The ramp stage S8 commences at time at time t$_7$ and extends for a duration of 4.5 min During the ramp stage S8, the reaction chamber 102 is cooled steadily and continuously at a substantially constant ramp rate from temperature T$_3$ to the temperature T$_2$ of 400° C. The pressure within the reaction chamber 102 is maintained at 200 Torr during ramp stage S8. During the ramp stage S8, Group V source gas comprising NH$_3$ is flown through the reaction chamber 102 at a flow rate of 14 slm, and a purge gas comprising N$_2$ at a flow rate of 23 slm and H$_2$ at a flow rate of 12 slm is passed through the reaction chamber 102.

The purge stage S9 commences at time at time t$_8$ and extends for a duration of 5.0 min During the purge stage S9, the reaction chamber 102 is maintained at the temperature T$_2$ of 400° C. while the pressure in the reaction chamber 102 is reduced from 200 Torr to atmospheric pressure. During the purge stage S9, a purge gas comprising N$_2$ at a flow rate of 16 slm is passed through the reaction chamber 102.

At time t$_9$, the unload stage S10 commences and extends until the workpiece substrates 106 have been unloaded from the reaction chamber 102. During the unload stage S10, the reaction chamber 102 is reduced to, and maintained at, the temperature T$_1$ of 350° C., and the pressure is maintained at atmospheric pressure while a purge gas comprising N$_2$ at a flow rate of 10 slm is passed through the reaction chamber 102.

Referring again to FIGS. 1 through 3, as previously mentioned, in accordance with embodiments of methods of the invention, the bulk III-nitride semiconductor material 22 may be deposited on the growth substrate 20 using an HPVE process (such as that described above) without ex situ formation (e.g., using another deposition system and/or in another reaction chamber) of the metal-nitride nucleation template layer 18 on the substrate 10 using an MOCVD process.

In some embodiments, the metal-nitride nucleation template layer 18 (FIG. 2) is formed on the substrate 100 using a non-MOCVD process in a first reaction chamber to form the growth substrate 20, and the bulk III-nitride semiconductor material 22 is deposited on the growth substrate 20 using an HVPE process such as that described above in a second reaction chamber that is different from the first reaction chamber. For example, the metal-nitride nucleation template layer 18 (FIG. 2) may comprise at least one of aluminum nitride (AlN) and titanium nitride (TiN), and may be formed on the substrate 100 using a plasma-enhanced physical deposition process (PEPVD) or a plasma-enhanced chemical deposition process (PECVD).

By way of example and not limitation, the metal-nitride nucleation template layer 18 may comprise aluminum nitride (AlN) and may be fabricated using plasma-enhanced physical vapor deposition (PEPVD) systems and methods as disclosed in U.S. Pat. No. 6,784,085, which issued Aug. 31, 2004 to Cuomo et al. For example, the substrate 100 and a Group III metal target may be loaded into a sputter deposition chamber (separate from the reaction chamber 102 of the HVPE deposition system 100). A highly energetic plasma-enhanced environment may be generated in the sputter deposition chamber using a suitable background gas such as argon. Separate nitrogen-containing source gas may be conducted into the chamber. In addition, or as an alternative, the gas utilized to generate the plasma may be used as the reactant source gas, in which case the background gas may provide the nitrogen species. The Group III metal target is sputtered to produce a Group III metal source vapor. The Group III metal source vapor combines with the nitrogen-containing gas, which is characterized as including one or more species such as diatomic nitrogen, atomic nitrogen, nitrogen ions, and partially ionized nitrogen, as well as nitrogen-containing compounds such as ammonia. As a result, reactant vapor species comprising components of the Group III metal and the nitrogen are produced within the reaction chamber, and are deposited on and over the exposed major surface 14 of the substrate 10. The as-deposited reactant vapor species is deposited on the substrate 100 to produce the metal-nitride nucleation template layer 18 of FIG. 2. In some embodiments, the as-deposited metal-nitride nucleation template layer 18 may be submitted to one or more thermal processes to improve the crystalline quality of the as-deposited metal-nitride nucleation template layer 18. For example, the as-deposited metal nitride material may be polycrystalline and/or amorphous, and may be subjected to one or more thermal processes to enhance the crystallinity of the metal-nitride nucleation template layer 18. In some embodiments, the one or more thermal processes may comprise a rapid thermal annealing (RTA) process. The one or more thermal processes may be performed, for example, in one or more of a furnace, a rapid thermal annealing chamber, and a chemical vapor deposition reactor. By way of example and not limitation, the one or more thermal processes may involve subjecting the as-deposited metal-nitride nucleation template layer 18 to a temperature or temperatures greater than approximately 600° C., greater than approximately 800° C., or even greater than approximately 1000° C. The one or more thermal processes for treating the as-deposited metal nitride nucleation template layer 18 may be performed within a controlled gaseous atmosphere. For example, the gaseous atmosphere may comprise one or more of ammonia, nitrogen, hydrogen, and argon.

The metal-nitride nucleation template layer 18 optionally may be doped with one or more dopant elements using known doping methods. For example, dopant-containing gases may be introduced into the reaction chamber under controlled conditions.

As another non-limiting example, the metal-nitride nucleation template layer 18 may comprise titanium nitride (TiN) and may be fabricated using plasma-enhanced chemical vapor deposition (PECVD) systems and methods as disclosed in U.S. Pat. No. 5,610,106, which issued Mar. 11, 1997 to Foster et al. For example, the substrate 10 may be loaded into a chemical vapor deposition chamber (separate from the reaction chamber 102 of the HVPE deposition system 100). A radio frequency (RF) generating showerhead/electrode may be provided in the CVD chamber, and reactant gases may be pumped into the chamber, through the showerhead/electrode, and toward the substrate 10. The reactant gases include titanium tetrachloride ($TiCl_4$), ammonia ($NH_3$), and a diluent. The diluent may comprise one or more of hydrogen, helium, argon, and nitrogen.

The substrate 10 may be spaced from about 0.25 to 3 inches from the showerhead/electrode, such that active ions will strike the substrate 10. A plasma is generated from the reactant gases using the RF generating showerhead/electrode as the reactant gases pass through the showerhead/electrode. The reactive ions of the plasma strike the substrate 10.

The pressure in the CVD chamber may be maintained between about 0.5 Torr and about 20 Torr (e.g., about 5 Torr). The substrate 10 may be maintained at a temperature of about 400° C. to about 500° C. (e.g., about 450° C.) during the deposition process. The substrate 10 may be heated by heating a support structure on which the substrate 10 rests during the deposition process. Further, the support structure on which the substrate 10 rests may be rotated at about 100 revolutions per minute (rpm) or more during the deposition process.

The concentration of the reactant gases in the CVD chamber may be controlled by flow rate. Generally, the titanium tetrachloride may be introduced at a flow rate of from about 1 sccm to about 40 sccm (e.g., about 10 sccm). The partial pressure of the $TiCl_4$ should be sufficiently low to form TiN. If the $TiCl_4$ partial pressure becomes too high, TiN may not be formed. When the total pressure is 5 Torr, the partial pressure of $TiCl_4$ may be less than about 0.02 Torr (e.g., from about 0.01 Torr to about 0.001 Torr). At the lower pressures (i.e., about 0.0001 Torr), the reaction rate may be significantly reduced and the step coverage may be unacceptable. As the total pressure increases over 5 Torr, the partial pressure of $TiCl_4$ may be increased accordingly. Generally, the molar ratio of $NH_3$ to $TiCl_4$ may be from about 2:1 ($NH_3$ to $TiCl_4$) to about 100:1 ($NH_3$ to $TiCl_4$) (e.g., about 10:1).

In accordance with such embodiments of methods of forming the metal-nitride nucleation template layer 18, the metal-nitride nucleation template layer 18 may be formed to have an average thickness $T_1$ of about twenty-five nanometers (25 nm) or less, or even about ten nanometers (10 nm) or less, and the bulk III-nitride semiconductor material 22 may be deposited on and over the metal-nitride nucleation template layer 18 to an average thickness $T_2$ of at least about two microns (2 μm), at least about five microns (5 μm), or even about ten microns (10 μm) or more.

Samples have been fabricated by forming an AlN nucleation template layer on a sapphire substrate using a PEPVD deposition process as disclosed in U.S. Pat. No. 6,784,085, and subsequently depositing bulk GaN over the AlN nucleation template layer using metal trichloride source gas in an HVPE deposition process as described hereinabove. In a first sample, the exposed major surface 19 (FIG. 2) of the AlN nucleation template layer was 0.5° offcut to the A plane of the AlN crystal structure, and the AlN nucleation template layer had an average thickness of about ten nanometers (10 nm). In a second sample, the exposed major surface 19 (FIG. 2) of the AlN nucleation template layer was 0.25° offcut to the M plane of the AlN crystal structure, and the AlN nucleation template layer had an average thickness of about twenty-five nanometers (25 nm).

The crystalline quality of the resulting bulk GaN material was measured using X-ray diffraction (XRD) analysis, and the crystalline quality was found to be substantially equivalent to reported crystalline qualities of bulk GaN formed using conventional MOCVD techniques. Further, the surface roughness of the exposed major surface 23 of the bulk GaN material was measured after depositing the bulk GaN material over the AlN nucleation template layers of the growth substrates. It was observed that the exposed major surface of the bulk GaN material deposited over the first sample (10 nm AlN nucleation template layer 0.5° offcut to the A plane) was smoother than the exposed major surface of the bulk GaN material deposited over the second sample (25 nm AlN nucleation template layer 0.25° offcut to the M plane). In particular, the first sample exhibited a root mean square (RMS) surface roughness of about 9.72 nm, while the second sample exhibited an RMS surface roughness of about 10.58 nm.

Referring again to FIGS. 1 through 3, in additional embodiments, the metal-nitride nucleation template layer 18 (FIG. 2) is formed on the substrate 100 using an MOCVD process in situ within the same reaction chamber 102 (FIGS. 4A and 4B) used to subsequently deposit the bulk III-nitride semiconductor material 22 thereover in an HVPE process. For example, the metal-nitride nucleation template layer 18 (FIG. 2) may comprise at least one of gallium nitride (GaN), aluminum nitride (AlN), aluminum gallium nitride ($Al_xGa_{1-x}N$), and titanium nitride (TiN).

Thus, in some embodiments, the deposition system 100 previously described with reference to FIGS. 4A and 4B may be capable of performing, and configured to perform, each of a MOCVD process and an HVPE process. Referring to FIG. 4A, by way of example and not limitation, one of the gas sources 128A, 128B may comprise a source of an organometallic precursor such as one or more of trimethylgallium (TMG), triethylgallium (TEG), trimethylaluminum (TMA), triethylaluminum (TEA), tetrakisdiethylaminotitanium (TDEAT), and tetrakis(dimethylamido)titanium (TDMAT). In such embodiments, it may not be necessary to utilize a thermalizing gas injector 150A, 150B in conjunction with the source of the organometallic precursor, although the organometallic precursor may be carried into the reaction chamber using a carrier gas. For example, a carrier gas may be bubbled through a reservoir of heated liquid organometallic precursor to form an organometallic vapor, which then may flow into the reaction chamber 102. The organometallic vapor 102 may decompose within the reaction chamber 102 resulting in the deposition of the metal-nitride nucleation template layer 18 on the workpiece substrates 106 (e.g., substrate 100 as shown in FIG. 1). MOCVD methods that may be used to form metal-nitride nucleation template layers 18 in situ within the same reaction chamber 102 used to deposit bulk III-nitride semiconductor material in an HVPE process using a deposition system as described herein are disclosed in, for example, U.S. Patent Application Publication No. 2009/0184398 A1, which published Jul. 23, 2009 in the name of Choi.

In such embodiments, the metal-nitride nucleation template layer 18 may be formed to have an average thickness $T_1$ of between about one-half of a nanometer (0.5 nm) and about two microns (2 μm), and the bulk III-nitride semiconductor material 22 may be formed to have an average thickness $T_2$ of at least about two microns (2 μm), at least about five microns (5 μm), at least about seven microns (7 μm), at least about ten microns (10 μm), at least about twenty microns (20 μm), or even at least about thirty microns (30 μm). Further, an exposed major surface 23 of the deposited bulk III-nitride semiconductor material 22 may have a root-mean-square surface roughness of about two nanometers (2.0 nm) or less (e.g., about 0.112 nm) in some embodiments.

Referring again to FIGS. 1 through 3, in additional embodiments, the metal-nitride nucleation template layer 18 (FIG. 2) is formed on the substrate 100 using a HVPE process in situ within the same reaction chamber 102 (FIGS. 4A and 4B) used to subsequently deposit the bulk III-nitride semiconductor material 22 thereover in an HVPE process as described herein. For example, the metal-nitride nucleation template layer 18 (FIG. 2) may comprise at least one of aluminum nitride (AlN) and titanium nitride (TiN), and may be formed using methods as disclosed in U.S. Pat. No. 6,221,174, which issued Apr. 24, 2001 to Chen et al., and in International Publication Number WO 2010/101715 A1, which published Sep. 10, 2010 in the name of Arena et al.

Referring to FIG. 4A, the source gas 128A may be employed in the formation of the metal-nitride nucleation template layer 18 (FIG. 2) in an HVPE process, and the source gas 128B may be employed in the formation of the bulk III-nitride semiconductor material 22 in a subsequent HVPE process.

As a non-limiting example, the metal-nitride nucleation template layer 18 (FIG. 2) may comprise aluminum nitride (AlN), and the gas source 128A may comprise a source of $AlCl_3$ gas. The source of $AlCl_3$ gas may include a reservoir of liquid $AlCl_3$ maintained at a temperature of at least 190° C. (e.g., approximately 195° C.) and a pressure of about 2.5 atmospheres, and optionally may include physical means for enhancing the evaporation rate of the liquid $AlCl_3$. Such physical means may include, for example, a device configured to agitate the liquid $AlCl_3$, a device configured to spray the liquid $AlCl_3$, a device configured to flow carrier gas rapidly over the liquid $AlCl_3$, a device configured to bubble carrier gas through the liquid $AlCl_3$, a device, such as a piezoelectric device, configured to ultrasonically disperse the liquid $AlCl_3$, and the like. As a non-limiting example, a carrier gas, such as He, $N_2$, $H_2$, or Ar, or a mixture thereof (e.g., a mixture of $N_2$ and $H_2$) may be bubbled through the liquid $AlCl_3$, while the liquid $AlCl_3$ is maintained at a temperature of at least 195° C., such that the source gas may include one or more carrier gases. Optionally, the $AlCl_3$ and a carrier gas comprising $H_2$ may be supplied to the thermalizing injector 150A, where the $AlCl_3$ may decompose and form AlCl and HCl. The HCl may react with liquid aluminum held in the thermalizing injector 150A to form additional AlCl. The gases then may be directed into the reaction chamber 102, where the AlCl may react with the $NH_3$ supplied from the gas source 128C to form AlN on and over the substrate.

As another non-limiting example, the metal-nitride nucleation template layer 18 (FIG. 2) may comprise titanium nitride (TiN), and the gas source 128A may comprise a source of $TiCl_4$ gas. The source of $TiCl_4$ gas may include a reservoir of liquid $TiCl_4$ maintained at a temperature of at least 80° C., and optionally may include physical means for enhancing the evaporation rate of the liquid $TiCl_4$, as discussed above. As a non-limiting example, a carrier gas, such as He, $N_2$, $H_2$, or Ar, or a mixture thereof (e.g., a mixture of $N_2$ and $H_2$) may be bubbled through the liquid $TiCl_4$, while the liquid $TiCl_4$ is maintained at a temperature of at least 137° C., such that the source gas may include one or more carrier gases. The $TiCl_4$ vapor then may be directed into the reaction chamber 102, where the $TiCl_4$ may react with the $NH_3$ supplied from the gas source 128C to form TiN on and over the substrate. Additional details relating to process parameters for the formation of TiN in such a process may be found in the aforementioned U.S. Pat. No. 6,221,174.

After forming the metal-nitride nucleation template layer 18 in the reaction chamber 102 using an HVPE process as discussed above, the bulk III-nitride semiconductor material 22 may be formed in the same reaction chamber 102 in an HVPE process as previously described with reference to FIGS. 3 and 8. The bulk III-nitride semiconductor material 22 may be deposited on the growth substrate 20 after forming the metal-nitride nucleation template layer 18 without removing the growth substrate 20 from the reaction chamber 102 after forming the metal-nitride nucleation template layer 18 and prior to depositing the bulk III-nitride semiconductor material 22 on the growth substrate 20.

Embodiments of methods of the present invention may enable the fabrication of bulk III-nitride semiconductor materials without requiring ex situ formation of a metal-nitride nucleation template layer using an MOCVD process. Thus, at least some embodiments of methods of the present invention may be more cost effective in the formation of bulk III-nitride semiconductor materials relative to previously known methods.

Additional non-limiting example embodiments of the invention are described below.

Embodiment 1: A method of depositing bulk III-nitride semiconductor material on a growth substrate, comprising: forming a metal-nitride nucleation template layer on a substrate to form the growth substrate; and depositing the bulk III-nitride semiconductor material on the growth substrate using a halide vapor phase epitaxy (HVPE) process, depositing the bulk III-nitride semiconductor material on the growth substrate comprising: decomposing at least one of a metal trichloride and a metal tetrachloride to form a metal chloride Group III precursor vapor, and reacting the metal chloride Group III precursor vapor with a Group V precursor vapor to form the bulk III-nitride semiconductor material on the growth substrate.

Embodiment 2: The method of Embodiment 1, wherein forming the metal-nitride nucleation template layer on the substrate comprises using a non-metallorganic chemical vapor deposition (MOCVD) process to form the metal-nitride nucleation template layer.

Embodiment 3: The method of Embodiment 1, wherein forming the metal-nitride nucleation template layer on the substrate comprises using a plasma-enhanced chemical vapor deposition (PECVD) process to form the metal-nitride nucleation template layer.

Embodiment 4: The method of Embodiment 3, wherein using the plasma-enhanced chemical vapor deposition (PECVD) process to form the metal-nitride nucleation template layer comprises: depositing metal-nitride material on the substrate; and subjecting the deposited metal-nitride material to one or more thermal processes to enhance a crystallinity of the deposited metal-nitride material.

Embodiment 5: The method of Embodiment 4, wherein subjecting the deposited metal-nitride material to one or more thermal processes to enhance a crystallinity of the deposited metal-nitride material comprises subjecting the deposited metal-nitride material to a rapid thermal annealing process.

Embodiment 6: The method of Embodiment 1, wherein forming the metal-nitride nucleation template layer on the substrate comprises using a halide vapor phase epitaxy (HVPE) process to form the metal-nitride nucleation template layer.

Embodiment 7: The method of Embodiment 6, wherein using a halide vapor phase epitaxy (HVPE) process to form the metal-nitride nucleation template layer comprises: decomposing at least one of $GaCl_3$, $InCl_3$, $AlCl_3$, and $TiCl_4$ to form at least one of a trichloride, a dichloride, and a monochloride Group III precursor vapor, and reacting the Group III precursor vapor with an $NH_3$ precursor vapor to form the metal nitride nucleation template layer on the substrate.

Embodiment 8: The method of any one of Embodiments 1 through 7, further comprising: forming the metal-nitride nucleation template layer in a first chamber; and depositing the bulk III-nitride semiconductor material on the growth substrate in a second, different chamber.

Embodiment 9: The method of any one of Embodiments 1 through 7, further comprising: forming the metal-nitride nucleation template layer in a chamber; and depositing the bulk III-nitride semiconductor material on the growth substrate in the chamber in which the metal nitride nucleation template layer is formed.

Embodiment 10: A method of depositing bulk III-nitride semiconductor material on a growth substrate, comprising: forming a metal-nitride nucleation template layer on a substrate using a non-metallorganic chemical vapor deposition (MOCVD) process in a first chamber to form the growth substrate; and depositing the bulk III-nitride semiconductor material on the growth substrate using a halide vapor phase epitaxy (HVPE) process in a second chamber, depositing the bulk III-nitride semiconductor material on the growth substrate comprising flowing $NH_3$ and at least one of a metal trichloride and a metal tetrachloride toward the second chamber.

Embodiment 11: The method of Embodiment 10, further comprising selecting the substrate to comprise a sapphire substrate.

Embodiment 12: The method of Embodiment 10 or Embodiment 11, further comprising selecting the metal-nitride nucleation template layer to comprise at least one of aluminum nitride and titanium nitride.

Embodiment 13: The method of any one of Embodiments 10 through 12, wherein forming the metal-nitride nucleation template layer on the substrate using the non-metallorganic chemical vapor deposition (MOCVD) process comprises forming the metal-nitride nucleation template layer on the substrate using a plasma-enhanced deposition process.

Embodiment 14: The method of any one of Embodiments 10 through 13, wherein depositing the bulk III-nitride semiconductor material on the growth substrate comprises depositing at least one of GaN, InN, AlN, InGaN, GaAlN, and InAlN on the growth substrate.

Embodiment 15: The method of any one of Embodiments 10 through 14, wherein depositing the bulk III-nitride semiconductor material on the growth substrate comprises depositing the bulk III-nitride semiconductor material on the growth substrate at a rate of at least about ten microns (10 μm) per hour.

Embodiment 16: The method of Embodiment 15, wherein depositing the bulk III-nitride semiconductor material on the growth substrate at a rate of at least about ten microns (10 μm) per hour comprises depositing the bulk III-nitride semiconductor material on the growth substrate at a rate of at least about twenty microns (20 μm) per hour.

Embodiment 17: The method of any one of Embodiments 10 through 16, wherein depositing the bulk III-nitride semiconductor material on the growth substrate comprises depositing a layer of the bulk III-nitride semiconductor material having an average thickness of at least about two microns on the growth substrate.

Embodiment 18: The method of any one of Embodiments 10 through 17, wherein forming the metal-nitride nucleation template layer on the substrate further comprises forming the metal-nitride nucleation template layer to have an average thickness of about fifty nanometers (50 nm) or less.

Embodiment 19: The method of Embodiment 18, wherein forming the metal-nitride nucleation template layer to have an average thickness of about fifty nanometers (50 nm) or less comprises forming the metal-nitride nucleation template layer to have an average thickness of about ten nanometers (10 nm) or less.

Embodiment 20: The method of any one of Embodiments 10 through 19, wherein flowing $NH_3$ and at least one of a metal trichloride and a metal tetrachloride toward the second chamber comprises flowing at least one of $GaCl_3$, $InCl_3$, $AlCl_3$, and $TiCl_4$ toward the second chamber.

Embodiment 21: The method of Embodiment 20, wherein flowing $NH_3$ and at least one of a metal trichloride and a metal tetrachloride toward the second chamber further comprises flowing the at least one of a metal trichloride and a metal tetrachloride toward the second chamber at a flow rate of about 100 sccm or less.

Embodiment 22: The method of Embodiment 21, wherein flowing the at least one of a metal trichloride and a metal tetrachloride toward the second chamber at the flow rate of about 100 sccm or less comprises flowing the at least one of a metal trichloride and a metal tetrachloride toward the second chamber at a flow rate of about 80 sccm or less.

Embodiment 23: The method of any one of Embodiments 20 through 22, further comprising selecting the at least one of a metal trichloride and a metal tetrachloride to comprise $GaCl_3$.

Embodiment 24: The method of any one of Embodiments 10 through 23, wherein depositing the bulk III-nitride semiconductor material results in an exposed major surface of the deposited bulk III-nitride semiconductor material having a root-mean-square surface roughness of about ten nanometers (10 nm) or less.

Embodiment 25: The method of any one of Embodiments 10 through 24, wherein depositing the bulk III-nitride semiconductor material results in an exposed major surface of the deposited bulk III-nitride semiconductor material having an average dislocation density of about 5 to $9 \times 10^8$ per square centimeter or less.

Embodiment 26: A method of depositing bulk III-nitride semiconductor material on a growth substrate, comprising: forming a metal-nitride nucleation template layer on a substrate using a metallorganic chemical vapor deposition (MOCVD) process in a chamber to form the growth substrate; and depositing the bulk III-nitride semiconductor material on the growth substrate using a halide vapor phase epitaxy (HVPE) process in the same chamber; wherein depositing the bulk III-nitride semiconductor material on the growth substrate using the halide vapor phase epitaxy (HVPE) process comprises flowing $NH_3$ and at least one of a metal trichloride and a metal tetrachloride toward the same chamber.

Embodiment 27: The method of Embodiment 26, further comprising selecting the substrate to comprise a sapphire substrate.

Embodiment 28: The method of Embodiment 26 or Embodiment 27, further comprising selecting the metal-nitride nucleation template layer to comprise at least one of gallium nitride, aluminum nitride, aluminum gallium nitride, hafnium nitride, chromium nitride, tungsten nitride, and titanium nitride.

Embodiment 29: The method of any one of Embodiments 26 through 28, wherein depositing the bulk III-nitride semiconductor material on the growth substrate comprises depositing at least one of GaN, InN, AlN, InGaN, GaAlN, and InAlN on the growth substrate.

Embodiment 30: The method of any one of Embodiments 26 through 29, wherein depositing the bulk III-nitride semiconductor material on the growth substrate comprises depositing the bulk III-nitride semiconductor material on the growth substrate at a rate of at least about ten microns (10 μm) per hour.

Embodiment 31: The method of Embodiment 30, wherein depositing the bulk III-nitride semiconductor material on the growth substrate at a rate of at least about ten microns (10 μm) per hour comprises depositing the bulk III-nitride semiconductor material on the growth substrate at a rate of at least about twenty microns (20 μm) per hour.

Embodiment 32: The method of any one of Embodiments 26 through 31, wherein depositing the bulk III-nitride semiconductor material on the growth substrate comprises depositing a layer of the bulk III-nitride semiconductor material having an average thickness of at least about two microns (2 μm) on the growth substrate.

Embodiment 33: The method of any one of Embodiments 26 through 32, wherein forming the metal-nitride nucleation template layer on the substrate further comprises forming the metal-nitride nucleation template layer to have an average thickness of between about one-half of a nanometer (0.5 nm) and about two microns (2 μm).

Embodiment 34: The method of any one of Embodiments 26 through 33, wherein flowing $NH_3$ and at least one of a metal trichloride and a metal tetrachloride toward the same chamber comprises flowing at least one of $GaCl_3$, $InCl_3$, $AlCl_3$, and $TiCl_4$ toward the same chamber.

Embodiment 35: The method of Embodiment 34, wherein flowing at least one of $GaCl_3$, $InCl_3$, $AlCl_3$, and $TiCl_4$ toward the same chamber further comprises flowing the at least one of $GaCl_3$, $InCl_3$, $AlCl_3$, and $TiCl_4$ toward the same chamber at a flow rate of about 100 sccm or less.

Embodiment 36: The method of Embodiment 35, wherein flowing the at least one of $GaCl_3$, $InCl_3$, $AlCl_3$, and $TiCl_4$ toward the same chamber at the flow rate of about 100 sccm or less comprises flowing the at least one of $GaCl_3$, $InCl_3$, $AlCl_3$, and $TiCl_4$ toward the same chamber at a flow rate of about 80 sccm or less.

Embodiment 37: The method of any one of Embodiments 26 through 36, further comprising selecting the at least one of a metal trichloride and a metal tetrachloride to comprise $GaCl_3$.

Embodiment 38: The method of any one of Embodiments 26 through 37, wherein depositing the bulk III-nitride semiconductor material results in an exposed major surface of the deposited bulk III-nitride semiconductor material having a root-mean-square surface roughness of about two nanometers (2.0 nm) or less.

Embodiment 39: The method of any one of Embodiments 26 through 38, wherein depositing the bulk III-nitride semiconductor material results in an exposed major surface of the deposited bulk III-nitride semiconductor material having an average dislocation density of about $5 \times 10^8$ per square centimeter or less.

Embodiment 40: A method of depositing bulk III-nitride semiconductor material on a growth substrate, comprising: forming a metal-nitride nucleation template layer on a substrate using a halide vapor phase epitaxy (HVPE) process in a chamber to form the growth substrate; and depositing the bulk III-nitride semiconductor material on the growth substrate using a halide vapor phase epitaxy (HVPE) process in the same chamber; wherein depositing the bulk III-nitride semiconductor material on the growth substrate using the halide vapor phase epitaxy (HVPE) process comprises flowing $NH_3$ and at least one of a metal trichloride and a metal tetrachloride toward the same chamber.

Embodiment 41: The method of Embodiment 40, further comprising selecting the substrate to comprise a sapphire substrate.

Embodiment 42: The method of Embodiment 40 or Embodiment 41, further comprising selecting the metal-nitride nucleation template layer to comprise at least one of aluminum nitride and titanium nitride.

Embodiment 43: The method of any one of Embodiments 40 through 42, wherein depositing the bulk III-nitride semiconductor material on the growth substrate comprises depositing at least one of GaN, InN, AlN, InGaN, GaAlN, and InAlN on the growth substrate.

Embodiment 44: The method of any one of Embodiments 40 through 43, wherein depositing the bulk III-nitride semiconductor material on the growth substrate comprises depositing the bulk III-nitride semiconductor material on the growth substrate at a rate of at least about ten microns (10 μm) per hour.

Embodiment 45: The method of Embodiment 44, wherein depositing the bulk III-nitride semiconductor material on the growth substrate at a rate of at least about ten microns (10 μm) per hour comprises depositing the bulk III-nitride semiconductor material on the growth substrate at a rate of at least about twenty microns (20 μm) per hour.

Embodiment 46: The method of any one of Embodiments 40 through 45, wherein depositing the bulk III-nitride semiconductor material on the growth substrate comprises depositing a layer of the bulk III-nitride semiconductor material having an average thickness of at least about two microns (2 μm) on the growth substrate.

Embodiment 47: The method of any one of Embodiments 40 through 46, wherein forming the metal-nitride nucleation template layer on the substrate further comprises forming the metal-nitride nucleation template layer to have an average thickness of about fifty nanometers (50 nm) or less.

Embodiment 48: The method of Embodiment 47, wherein flowing $NH_3$ and at least one of a metal trichloride and a metal tetrachloride toward the same chamber further comprises flowing the at least one of a metal trichloride and a metal tetrachloride toward the same chamber at a flow rate of about 100 sccm or less.

Embodiment 49:The method of Embodiment 48, wherein flowing the at least one of a metal trichloride and a metal tetrachloride toward the same chamber at the flow rate of about 100 sccm or less comprises flowing the at least one of a metal trichloride and a metal tetrachloride toward the same chamber at a flow rate of about 80 sccm or less.

Embodiment 50:The method of any one of Embodiments 40 through 49, further comprising selecting the at least one of a metal trichloride and a metal tetrachloride to comprise at least one of $GaCl_3$, $InCl_3$, $AlCl_3$, and $TiCl_4$.

Embodiment 51:The method of any one of Embodiments 40 through 50, wherein depositing the bulk III-nitride semiconductor material results in an exposed major surface of the deposited bulk III-nitride semiconductor material having a root-mean-square surface roughness of about ten nanometers (10.0 nm) or less.

Embodiment 52:The method of any one of Embodiments 40 through 51, wherein depositing the bulk III-nitride semiconductor material results in an exposed major surface of the deposited bulk III-nitride semiconductor material having an average dislocation density of about $5 \times 10^8$ per square centimeter or less.

Embodiment 53:The method of any one of Embodiments 40 through 52, wherein depositing the bulk III-nitride semiconductor material on the growth substrate using the halide vapor phase epitaxy (HVPE) process in the same chamber comprises depositing the bulk III-nitride semiconductor material on the growth substrate without removing the growth substrate from the same chamber after forming the metal-nitride nucleation template layer on the substrate to form the growth substrate and prior to depositing the bulk III-nitride semiconductor material on the growth substrate.

Embodiment 54:A structure comprising bulk III-nitride semiconductor material, the structure fabricated in accordance with a method as recited in any one of Embodiments 1 through 53.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternative useful combinations of the elements described, will become apparent to those skilled in the art from the description. Such modifications are also intended to fall within the scope of the appended claims.

The invention claimed is:

1. A method of depositing bulk III-nitride semiconductor material on a growth substrate, comprising:
    forming a metal-nitride nucleation template layer on a substrate to form the growth substrate; and
    depositing the bulk III-nitride semiconductor material on the growth substrate using a halide vapor phase epitaxy (HVPE) process, depositing the bulk III-nitride semiconductor material on the growth substrate comprising:
        decomposing at least one of a metal trichloride and a metal tetrachloride to form a metal chloride Group III precursor vapor; and
        reacting the metal chloride Group III precursor vapor with a Group V precursor vapor to form the bulk III-nitride semiconductor material on the growth substrate.

2. The method of claim 1, wherein forming the metal-nitride nucleation template layer on the substrate comprises using a non-metallorganic chemical vapor deposition (MOCVD) process to form the metal-nitride nucleation template layer.

3. The method of claim 1, wherein forming the metal-nitride nucleation template layer on the substrate comprises using a plasma-enhanced chemical vapor deposition (PECVD) process to form the metal-nitride nucleation template layer.

4. The method of claim 3, wherein using the plasma-enhanced chemical vapor deposition (PECVD) process to form the metal-nitride nucleation template layer comprises:
    depositing metal-nitride material on the substrate; and
    subjecting the deposited metal-nitride material to one or more thermal processes to enhance a crystallinity of the deposited metal-nitride material.

5. The method of claim 4, wherein subjecting the deposited metal-nitride material to one or more thermal processes to enhance a crystallinity of the deposited metal-nitride material comprises subjecting the deposited metal-nitride material to a rapid thermal annealing process.

6. The method of claim 1, wherein forming the metal-nitride nucleation template layer on the substrate comprises using a halide vapor phase epitaxy (HVPE) process to form the metal-nitride nucleation template layer.

7. The method of claim 6, wherein using a halide vapor phase epitaxy (HVPE) process to form the metal-nitride nucleation template layer comprises:
    decomposing at least one of $GaCl_3$, $InCl_3$, $AlCl_3$, and $TiCl_4$ to form at least one of a trichloride, a dichloride, and a monochloride Group III precursor vapor; and
    reacting the Group III precursor vapor with an $NH_3$ precursor vapor to form the metal nitride nucleation template layer on the substrate.

8. The method of claim 1, further comprising:
    forming the metal-nitride nucleation template layer in a first chamber; and
    depositing the bulk III-nitride semiconductor material on the growth substrate in a second, different chamber.

9. The method of claim 1, further comprising:
    forming the metal-nitride nucleation template layer in a chamber; and
    depositing the bulk III-nitride semiconductor material on the growth substrate in the chamber in which the metal nitride nucleation template layer is formed.

10. The method of claim 1, wherein decomposing at least one of a metal trichloride and a metal tetrachloride to form a metal chloride Group III precursor vapor comprises decomposing the at least one of a metal trichloride and a metal tetrachloride to form a metal monochloride vapor.

11. The method of claim 1, wherein decomposing at least one of a metal trichloride and a metal tetrachloride to form a metal chloride Group III precursor vapor comprises thermally decomposing a metal trichloride in the presence of a carrier gas to form a metal monochloride vapor and a chlorinated gas.

12. The method of claim 11, further comprising reacting the chlorinated gas with liquid gallium to form additional metal monochloride vapor.

* * * * *